(12) United States Patent
Tanabe

(10) Patent No.: US 6,989,300 B1
(45) Date of Patent: Jan. 24, 2006

(54) METHOD FOR FORMING SEMICONDUCTOR FILMS AT DESIRED POSITIONS ON A SUBSTRATE

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 112 days.

(21) Appl. No.: 09/614,286

(22) Filed: Jul. 12, 2000

(30) Foreign Application Priority Data

Jul. 13, 1999 (JP) ............................................ 11-229979

(51) Int. Cl.
H01L 21/84 (2006.01)
H01L 21/20 (2006.01)
H01L 21/36 (2006.01)
C30B 13/00 (2006.01)
C30B 21/04 (2006.01)
C30B 28/08 (2006.01)

(52) U.S. Cl. ........................ 438/166; 438/164; 438/487; 117/44

(58) Field of Classification Search ................... 117/44; 438/486, 487, 150, 166, 798, 675, 745, 756, 438/239, 250; 257/64, 66, 72, 75, 49
See application file for complete search history.

(56) References Cited

U.S. PATENT DOCUMENTS

| 3,712,740 A | * | 1/1973 | Hennings | ................... | 356/152.2 |
| 4,724,219 A | | 2/1988 | Ridinger | | |
| 5,477,058 A | | 12/1995 | Sato | | |

(Continued)

FOREIGN PATENT DOCUMENTS

EP 0178447 A2 4/1986
EP 1 067 593 A2 1/2001
GB 2133618 A 7/1984

(Continued)

OTHER PUBLICATIONS

Machine language translation of JP 05021343 A.*
Im et al. "Single–crystal Si films for thin–film transistor devices" Applied Physics Letters 70(25) Jun. 23, 1997, pp. 3434–3436.*
Mrs. Bulletin–Mar. 1996, Crystalline Si Films for Integrated Active–Matrix Liquid–Crystal Displays, James S. Im et al, pp. 39–48.
Appl. Phys. Lett. 69(19), Nov. 4, 1996, American Institute of Physics, "Sequential lateral solidification of thin silicon films on $SiO_2$".
Appl. Phys. Lett. 70 (25), Jun. 23, 1997, American Institute of Physics, "Single Crystal Si films for thin–film transistor devices".

(Continued)

Primary Examiner—Erik Kielin
(74) Attorney, Agent, or Firm—Katten Muchin Zavis Rosenman

(57) ABSTRACT

A semiconductor film formation method allowing a single-crystal semiconductor film to be formed at a desired position on a substrate with reliability is disclosed. After preparing the substrate having a non-single-crystal semiconductor film formed thereon and an optical mask having a predetermined pattern, a projection area of the optical mask is relatively positioned at the desired position on the substrate. Thereafter, the desired position of the non-single-crystal semiconductor film is irradiated with laser light through the optical mask to change an irradiated portion of the non-single-crystal semiconductor film to the single-crystal semiconductor film. Then, an insulation film is formed on at least the single-crystal semiconductor film.

4 Claims, 19 Drawing Sheets

U.S. PATENT DOCUMENTS

| | | | |
|---|---|---|---|
| 5,492,843 A * | 2/1996 | Adachi et al. | 438/479 |
| 5,696,003 A * | 12/1997 | Makita et al. | 148/DIG. 16 |
| 5,821,562 A * | 10/1998 | Makita et al. | 257/49 |
| 5,886,366 A * | 3/1999 | Yamazaki et al. | 257/59 |
| 5,976,988 A * | 11/1999 | Konuma et al. | 216/101 |
| 6,136,632 A * | 10/2000 | Higashi | 438/166 |
| 6,169,292 B1 * | 1/2001 | Yamazaki et al. | 257/155 |
| 2001/0012702 A1 | 8/2001 | Kim | |

FOREIGN PATENT DOCUMENTS

| | | |
|---|---|---|
| JP | 57-148351 | 9/1982 |
| JP | 63-292619 | 11/1988 |
| JP | 2-102517 | 4/1990 |
| JP | 05021343 A * | 1/1993 |
| JP | 5-90191 | 4/1993 |
| JP | 5-142745 | 6/1993 |
| JP | 5-182923 | 7/1993 |
| JP | 06-163590 | 6/1994 |
| JP | 6-320292 | 11/1994 |
| JP | 7-99321 | 4/1995 |
| JP | 7-118443 | 12/1995 |
| JP | 08-125192 | 5/1996 |
| JP | 9-7911 | 1/1997 |
| JP | 9-17729 | 1/1997 |
| JP | 9-148246 | 6/1997 |
| JP | 10-116989 | 5/1998 |
| JP | 10-149984 | 6/1998 |
| JP | 11-17185 | 1/1999 |
| JP | 11-016836 | 1/1999 |
| JP | 11-064883 | 3/1999 |
| KR | 1999-023628 | 3/1999 |
| KR | 1999-0031801 | 5/1999 |

OTHER PUBLICATIONS

Jpn. J. Appl. Phys. vol. 34 (1995) pp. 1759–1764 Part 1, No. 4A, Apr. 1995, "Effects of Light Pulse Duration on Excimer–Laser Crystallization Characteristics of Silicon Thin Films".

AM–LCD 97, Digest of Technical Papers 1997 Workshop, Sep. 11–12, 1997, Improvement of structural and electrical properties in low–temperature gate oxides for poly–Si TFTs by controlling $O_2/SiH_4$ ratios.

NEC Corporation 1994, "Excimer Laser Crystallization of Amorphous Silicon Films", vol. 35, No. 3, pp. 254–260.

* cited by examiner

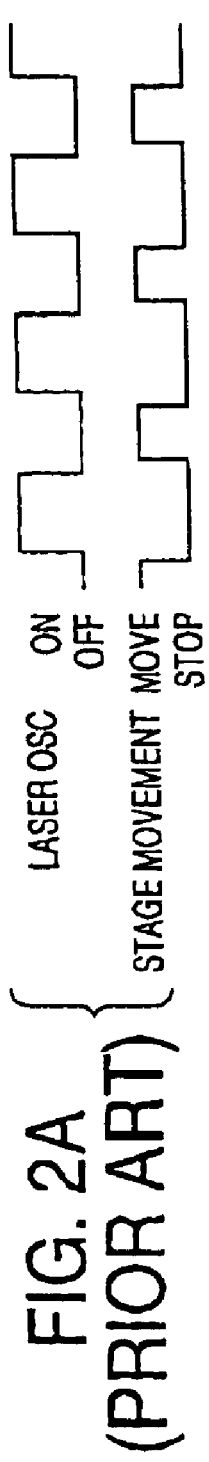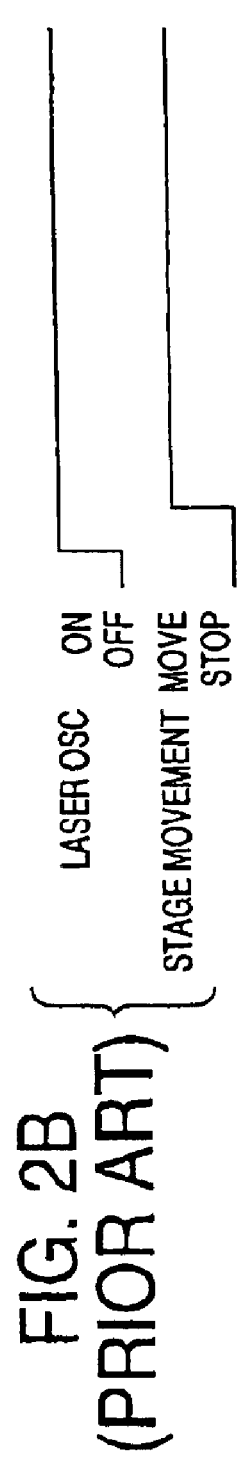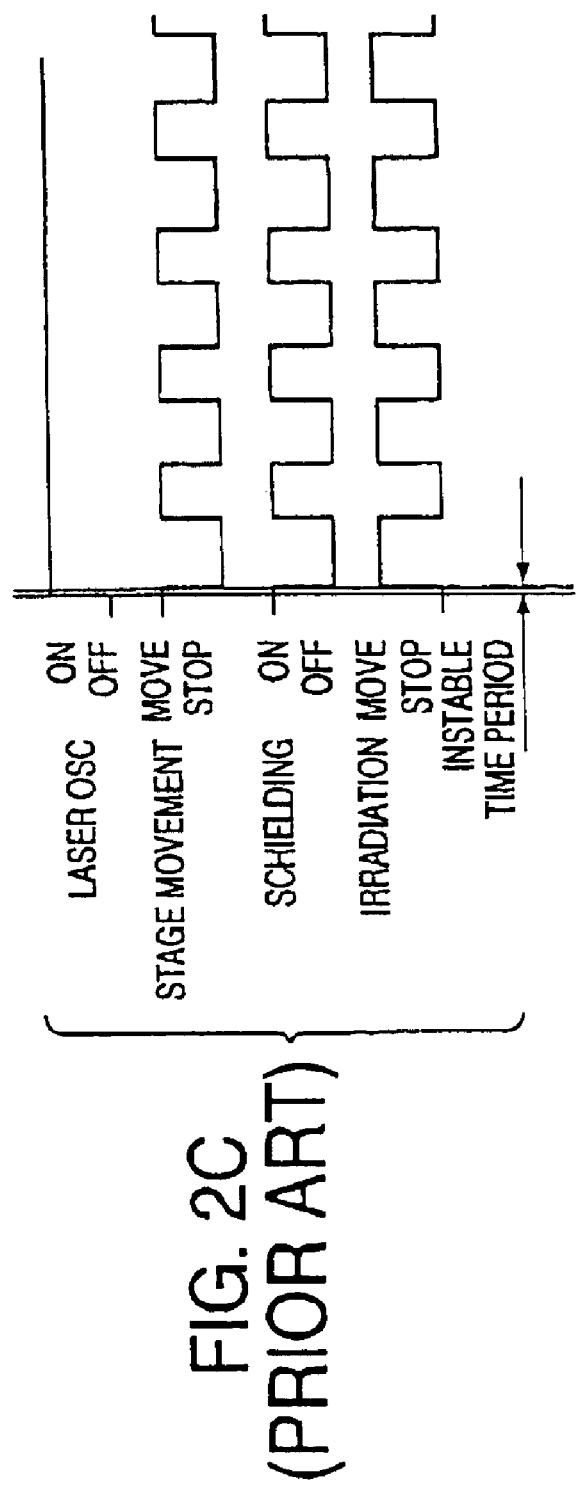

STAGE MOVEMENT DIRECTIONS

STAGE TILT DIRECTIONS

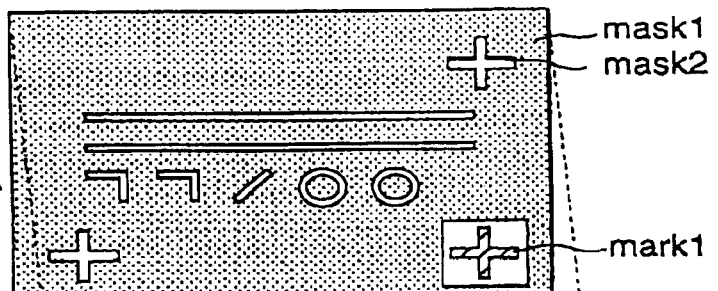
FIG. 12A
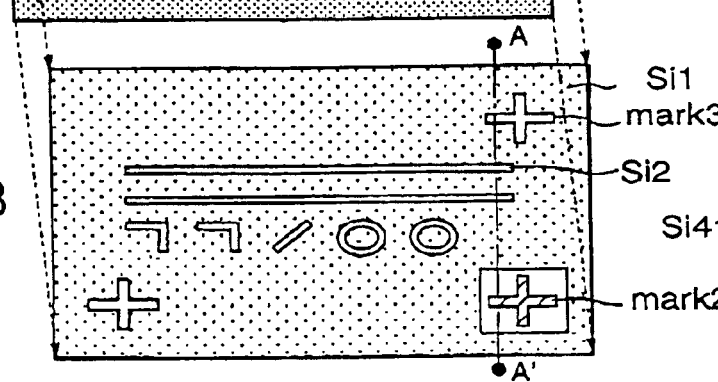
FIG. 12B
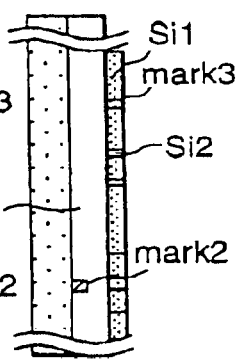
FIG. 12C
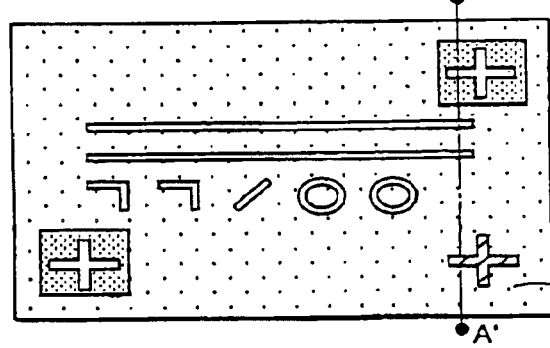
FIG. 12D
FIG. 12E

METHOD FOR FORMING SEMICONDUCTOR FILMS AT DESIRED POSITIONS ON A SUBSTRATE

BACKGROUND OF THE INVENTION

1. Field of the Invention

The present invention relates to techniques for forming semiconductor thin films to be used for a semiconductor device such as a thin film transistor. Particularly, the present invention relates to a technique of forming a semiconductor film by light irradiation. For example, the present invention is applicable to a technique of obtaining a field-effect transistor by forming a gate insulating layer on a single-crystal silicon film, and a driving circuit for a display, a sensor, etc. that are structured by these semiconductor thin films and field-effect thin film transistors.

2. Description of the Related Art

First, state-of-the-art techniques in the above-described technical field will be explained in detail, and problems will be pointed out.

As representative techniques of forming a thin-film transistor (TFT) on a glass substrate, there have been known a hydrogenated amorphous silicon (a-Si:H) TFT technique and a poly-crystal silicon (poly-Si) TFT technique. The a-Si:H TFT technique has a maximum temperature of about 300° C. in a manufacturing process, and achieves a carrier mobility of about 1 $cm^2$/Vsec. This technique is used as a switching transistor for each pixel In an active matrix type (AM-) liquid crystal display (LCD). This switching transistor is driven by a driver integrated circuit (an LSI formed on a single-crystal silicon substrate) disposed on the periphery of a screen area. Since a switching TFT is provided for each pixel, this has a feature that it is possible to obtain a satisfactory picture quality by reducing cross-talks, as compared with a passive matrix type LCD that sends an electric signal for driving a liquid crystal from a separate peripheral driver circuit.

On the other hand, the poly-Si TFT technique uses a high-temperature process similar to LSI process of about 1,000° C. by using, for example, a quartz substrate. Thus, it is possible to obtain a carrier mobility of 30 to 100 $cm^2$/Vsec. Since such a high carrier mobility can be realized, when this is applied to a liquid crystal display, for example, it is possible to simultaneously form a pixel TFT for driving each pixel and a peripheral driving circuit on the same substrate. Therefore, there is an advantage that it is possible to contribute to a reduction in the manufacturing process cost and to reduce the size of a device. Along with a reduction in the size of a device and an introduction of a high resolution, a bonding pitch between an AM-LCD substrate and peripheral driver integrated circuits must be made smaller. A tape automated bonding or a wire bonding method cannot cope with this situation.

However, a low-cost low-softening-point glass that can be used for the a-Si:H TFT technique cannot be used in the poly-crystal silicon TFT technique because of the above-described high-temperature process. For improving this point, it is necessary to lower the temperature in the poly-crystal silicon TFT technique. In order to meet this requirement, there has been progressed a research and development of a technique of forming a poly-crystal silicon film at low temperature.

As has been known, generally, the laser crystallization is achieved by using a pulse laser beam irradiator.

FIG. 1 is a schematic view showing one example of a structure of a pulse laser beam irradiator. A laser beam (1106) supplied from a pulse laser beam source (1101) reaches a silicon thin film (1107) on a glass substrate (118) as an irradiated object through an optical path defined by optical devices such as mirrors (1102, 1103, 1105) and a beam homogenizer (1104) installed for homogenizing a spatial intensity. Generally, since one irradiation range is small, a laser beam irradiation is carried out at a desired position on the glass substrate by moving the substrate on an x-y stage (1109). There is also a method of moving the optical devices or combining the optical devices with the stage instead of moving the x-y stage.

For example, an example of mounting a substrate on an x-direction stage and mounting a homogenizer on a y-direction stage is shown in a paper written by J. Im and R. Sposili, Crystalline Si films for integrated active-matrix-liquid-crystal displays. Materials Research Society Bulletin magazine. vol. 21, (1996), 39 (hereafter, referred to as publication 1).

A laser beam irradiation is also carried out in vacuum or in a high-purity gas atmosphere within a vacuum chamber. The publication 1 also describes that, as demanded, a cassette (1110) storing a glass substrate on which a silicon thin film is formed and a substrate carrying mechanism (1111) are also provided to mechanically take out the substrate from the cassette to the stage and accommodate the substrate in the cassette.

Further, there is also disclosed a technique of crystallizing an amorphous silicon thin film on an amorphous substrate by Irradiating a short-wavelength pulse laser beam and applying this to a thin-film transistor in Japanese Patent Application Examined Publication No. 7-118443. According to the disclosed method, it is possible to crystallize amorphous silicon without heating the whole substrate to a high temperature. Therefore, there is an advantage that it is possible to manufacture a semiconductor device or a semiconductor integrated circuit on a large area like a liquid crystal display or on a low-cost substrate like glass.

However, as described in the publication, an irradiation intensity of about 50–500 $mJ/cm^2$ is necessary for crystallizing an amorphous silicon thin film by using a short-wavelength laser beam. On the other hand, a light-emission output of a pulse laser device generally obtainable at present is about 1 J/pulse at maximum. Therefore, based on a simple conversion, an area that can be processed by irradiation at one time is only about 2 to 20 $cm^2$. Therefore, in order to crystallize by laser beams the whole surface of a substrate having a substrate size of 47×37 cm, for example, it is necessary to irradiate laser beams to at least 87 positions, or 870 positions depending on a condition. When the substrate has a large size like a substrate size of 1 by 1 meters square, the number of positions where irradiation is necessary increases accordingly. The laser crystallization in this case is also carried out by using a pulse laser beam irradiator of the structure shown in FIG. 1.

In order to form a plurality of thin film semiconductors homogeneously on a large-area substrate by applying the above method, it has been known that a technique as disclosed in Japanese Patent Application Unexamined Publication No. 3-315863, for example, is effective. That is, a method of dividing semiconductors into areas, each being smaller than a beam size, and based on a step-end-repeat manner, sequentially repeating an irradiation of a few pulses + a move of an irradiation area + an irradiation of a few pulses + a move of an irradiation area + - - -, is effective.

There is also a control method that a laser beam oscillation and a move of a stage (that is, a substrate) or a beam are carried out alternately, as shown by a laser operation method in FIG. 2A.

However, according to this method, even when a currently available pulse laser device having oscillation intensity homogeneity of ±5 to 10% (during a continuous oscillation) is used, there is the following problem. For example, when an irradiation of 1 pulse to 20 pulses/position is repeated, an oscillation intensity variance exceeds ±5 to 10%. As a result, the homogeneity of a poly-crystal silicon thin film and poly-crystal silicon thin film transistor characteristics obtained Is not sufficient. Particularly, an occurrence of a strong beam or a weak beam caused by an unstable discharging at an initial stage of a laser beam oscillation, which is called a spiking, is one of factors of inhomogeneity.

In order to correct the above difficulty, a method of controlling an applied voltage at the time of a next oscillation based on a result of intensity accumulation has been also known. However, this has a problem in that a weak beam is oscillated although it is possible to restrict an occurrence of spiking.

As shown in FIG. 3, when an irradiation time and a non-irradiation time continue alternately, the intensity of a first pulse oscillated during each irradiation time becomes most unstable and varies. Further, an irradiation intensity hysteresis is different depending on an irradiation position. Therefore, there arises a problem that it is not possible to obtain sufficient homogeneity of transistors and thin film integrated circuits on the substrate.

As another method of avoiding such a spiking, there has been known a method of avoiding the spiking by starting a laser beam oscillation before starting an irradiation in the device forming area, as shown in FIG. 2B. However, this method cannot be applied when a laser beam oscillation and a stage move as shown in FIG. 2A are repeated intermittently.

In order to avoid these problems, Japanese Patent Application Unexamined Publication No. 5-90191 has proposed a method of continuously oscillating beams from a pulse laser beam source and not irradiating to a substrate during a stage move period by using a light shielding device. In other words, as shown in FIG. 2C, laser beams are oscillated continuously in a certain frequency, and a move of a stage to a desired irradiation position and a shielding and a release of an optical path are synchronized. This makes it possible to irradiate a desired irradiation position with a laser beam of a stable intensity. According to this method, it becomes possible to irradiate stable laser beams to the substrate. However, this method has a problem in that a wasteful laser beam oscillation increases that does not contribute to the formation of a poly-crystal silicon thin film. Further, productivity of a poly-crystal silicon thin film to the high-cost laser beam source and the life of an excitation gas are lowered, and productivity of a poly-crystal silicon thin film to electric power required for a laser beam oscillation is lowered. Therefore, the production cost increases.

Further, when a substrate has been irradiated with a laser beam of an excessive intensity as compared with the desired intensity due to a variance of the irradiation intensity, there is a risk of an occurrence of damage to the substrate. Particularly, after a laser beam has been transmitted through a substrate in an imaging device like an LCD, this incurs a light scattering in a damaged area of the substrate, which results in a reduction in the picture quality.

Next, a technique of compressed-projecting a pattern on an optical mask onto a silicon thin film and crystallizing it according to the pattern is disclosed, for example, in a paper written by R. Sposili and J. Im, "Sequential lateral solidification of thin silicon films on $SiO_2$", Applied Physics Letters, vol. 69, (1996), 2864 (a publication 2), and a paper written by J. Im, R. Sposili and M. Crowder, "Single-crystal Si films for thin film transistor devices", Applied Physics Letters, vol. 70, (1997), 3434 (a publication 3).

According to each of the above publications 2 and 3, a compressed projection of about 1:5 is carried out by using 308 nm excimer laser, a variable-energy attenuater, a variable-focus field lens, a patterned-mask, a two-clement imaging lens, and a sub-micrometer-precision translation stage. Thus, a beam size of $\mu$m order and a moving pitch of a substrate stage of $\mu$m order are achieved.

However, when this method is used for processing a large substrate as described above, a laser beam with which the optical mask is irradiated has a spatial intensity profile depending on the light source. Therefore, a critical intensity distribution deviation occurs in an exposure pattern transmitted through the center and the periphery of the mask, for example. This has made it impossible to obtain a crystalline silicon thin film having a desired homogeneity. Further, since an ultraviolet ray having a short wavelength is compressed-projected, the depth of focus is small, which has a problem of generating an irradiation depth deviation due to a camber and a flexure. Further, as the substrate becomes larger, it becomes difficult to secure a mechanical precision of the stage. Furthermore, a declining of the stage and a deviation of the substrate on the stage during a move adversely affect the desired irradiation condition of a laser beam.

In carrying out the above laser beam irradiation, a method of emitting a plurality of pulses with a certain delay time has been disclosed in a paper; Ryoichi Ishihara et al., "Effects of light pulse duration on eximer laser crystallization characteristics of silicon thin films", Japanese journal of applied physics, vol. 34, No. 4A, (1995) pp 1759 (a publication 4). According to this publication 4, the crystallization solidification rate of a molten silicon in a laser recrystallization process is 1 m/sec or above. In order to obtain a satisfactory crystallization growth, it is necessary to lower the solidification rate. When a second laser beam pulse is emitted immediately after a completion of the solidification, a recrystallization process with a small solidification rate is obtained by the second irradiation.

According to a temperature change (a time-varying temperature curve) of silicon as shown in FIG. 4, the temperature of silicon rises along with the irradiation of laser energy (for example, an intensity pulse showing a waveform in FIG. 5). When a starting material is a-Si, the temperature further rises after passing a fusing point of a-Si. When the supply of energy becomes lower than a value necessary for a temperature rise, cooling starts. At a solidification point of the crystalline Si, solidification is carried out and then the solidification finishes. After that, the crystalline Si is cooled to an atmospheric temperature. When the solidification of the silicon proceeds in a film-thickness direction starting from a silicon-substrate interface, the average value of the solidification rate is expressed by the following expression:

Average value of solidification rate=film thickness of silicon/solidification time.

In other words, when the silicon film thickness is constant, it is necessary to make longer the solidification time so as to make the solidification rate slower. Accordingly, in a process of maintaining an ideal state in terms of thermal equilibrium, it is possible to expand the solidification time by increasing an ideal input energy, that is, laser beam irradiation energy.

However, as pointed out in the above publication, there is a problem that an increase in the irradiation energy causes the silicon film to be amorphous or of fine crystallization. In the real fusion and recrystallization process, the ideal temperature change as shown in FIG. 4 is not obtained. Generally, the temperature is raised excessively during a heating time, and the temperature is lowered excessively during a cooling, and then a stabilized state reaches. Particularly, when the cooling rate during the cooling period is large and a process of excessive cooling is experienced, crystallization does not occur near the solidification point. Instead, an amorphous solid is formed by a rapidly cooled solidification. In the case of a thin film, instead of forming an amorphous film, a fine crystallized film is formed depending on the condition, as described in the above publication. The fine crystal film has extremely small particles as compared with a poly-crystal thin film or a single-crystal thin film. Therefore, this has a problem in that there exist a large number of crystalline grain boundaries of a large grain boundary potential, and an ON current is lowered or an off-leak current increases when this method has been applied to a thin-film transistor, for example.

FIG. 6 shows a maximum cooling rate (Cooling rate, K/sec) obtained by numerical computation when an excimer laser beam of a wavelength 308 nm has been emitted onto a silicon thin film of a film thickness 75 nm, and a threshold value of irradiation intensity for crystallization to fine crystallization obtained from an SEM observation of the film after the laser beam irradiation. A pulse waveform of a laser beam emission used for the experiment is shown in FIG. 5. This has three main peaks, and the light emission time is about 120 nsec. This pulse waveform has a light emission time of more than five times that of a square pulse of a pulse width 21.4 nsec that is assumed and described in the publication 4. Therefore, it can be expected that a reduction in the solidification rate as described in the publication 4 can be achieved in a single pulse irradiation.

A temperature-time curve of silicon obtained by numerical computation at the time of a laser recrystallization using the above pulse waveform becomes as shown in FIG. 7.

FIG. 7 shows a temperature change of a silicon thin film when the silicon thin film has a film thickness of 75 nm, a substrate used is $SiO_2$, and irradiation intensity of XeCl laser beam (a wavelength of 308 nm) is 450 $mJ/cm^2$. The temperature reached a maximum temperature in about 60 nsec after a peak of a second light emission had almost finished, and then the cooling is started. (In the present numerical computation, the fusion and solidification point values of amorphous silicon is used in this case. A behavior near the solidification point is different from a real one. Particularly, when a crystallized film is obtained, the crystallization is completed near the solidification point of the crystalline silicon).

It can be known that the cooling is started by once having a large tilt, and the tilt of about 100 nsec when a third peak exists becomes very small. After a lapse of 120 nsec when the light emission finishes completely, a rapid cooling occurs again, and then solidification occurs. Generally, in the case of a process of solidification from a liquid that has been subjected to "rapid cooling" that greatly deviates from a thermal equilibrium process, it is not possible to obtain sufficient solidification time necessary for forming a crystal structure, and an amorphous solid is formed.

FIG. 6 shows an estimated result of a maximum cooling rate after finishing a light emission at each irradiation intensity based on the temperature-time curve of silicon shown in FIG. 7. It can be known that the cooling rate increases along with an increase in the irradiation intensity. On the other hand, a structure of a silicon thin film after the laser beam irradiation has been observed with a scanning-type electronic microscope. As shown in FIG. 6, a particle size once increases along with an increase in the irradiation intensity. However, a fine crystallization has been observed under a set irradiation intensity condition of about 470 $mJ/cm^2$. Similarly, when the number of irradiation pulses has been set to three pulses, a partially fine crystallized area remains under the set irradiation intensity condition of about 470 $mJ/cm^2$. However, unlike the case of one pulse, a remarkable increase in the particle size has been observed (see FIG. 8 showing a crystal state of a laser recrystallized silicon thin film corresponding to each irradiation intensity and number of irradiation).

Actual irradiation intensity becomes about 5 to 10% higher than a set value particularly in a first few pulses of an excimer laser beam. Therefore, a threshold intensity at which a fine crystallization occurs can be estimated as about 500 $mJ/cm^2$. From the above result, by assuming a cooling rate based on the condition of 500 $mJ/cm^2$ shown in FIG. 6, it has been known that a fine crystallization occurs under the cooling rate condition of about $1.6 \times 10^{10}$° C./sec or above. When an irradiated film is a-Si, a fine crystallization occurs under the condition of about 500 $mJ/cm^2$ or above. Similarly, when an irradiated film is poly-Si, by applying this cooling rate, an irradiation intensity that is about 30 $mJ/cm^2$ larger than that of a-Si is indicated. Therefore, by controlling the cooling rate to $1.6 \times 10^{10}$° C./sec or lower, it becomes possible to prevent a fine crystallization and an amorphous state. As a result, it is possible to obtain a satisfactory crystal growing process.

Next, an introduction of a second laser beam by delaying it after a first laser beam will be explained. As already described, a laser beam at a later period of light emission mitigates an increase in the cooling rate, and the cooling rate after finishing the light emission rules the crystallization. In other words, it is considered that the preceding cooling process is initialized by energy finally introduced. When further additional energy is introduced, the process is considered to be once initialized and solidification is repeated again even if an amorphous state and fine crystallization has occurred due to rapid cooling in the preceding solidification process, because energy has been stored. (Because of a short period of time like a nanosecond order, thermal conduction to the substrate and irradiation to the atmosphere is considered to be small. Of course, the time during which a sufficient heat discharging is possible is not taken into consideration.) Therefore, it is possible to expect a satisfactory crystal growth by a rapid cooling rate after finishing a secondary heating by the energy input again. As a maximum cooling rate and a cooling rate near a solidification point show in FIG. 9, the cooling rate is controlled to a desired value by controlling the delay time.

On the other hand, a technique of carrying out a process of forming an a-Si thin film as a laser beam irradiated material, a laser beam irradiation process, a plasma hydrogenation process and a process of forming a gate insulation film, sequentially or by changing the sequence, without an exposure to the atmosphere, has been disclosed in the following publications.

Japanese Patent Application Unexamined Publication No. 5-182923; after thermally processing an amorphous semiconductor thin film, a laser beam is irradiated without an exposure to the atmosphere.

Japanese Patent Application Unexamined Publication No. 7-99321; a substrate having a laser crystallized polycrystal silicon thin film Is carried to a plasma hydrogenation and gate insulation film forming processes without exposing the substrate to the atmosphere.

Japanese Patent Application Unexamined Publication No. 9-7911; a substrate having a laser crystallized polycrystal silicon thin film is carried to a gate insulation film forming processes without exposing the substrate to the atmosphere.

Japanese Patent Application Unexamined Publication No. 9-17729; a substrate having a laser crystallized polycrystal silicon thin film is carried to a gate insulation film forming processes without exposing the substrate to the atmosphere, thereby preventing an adhesion of an impurity to the surface of the poly-crystal silicon.

Japanese Patent Application Unexamined Publication No. 9-148246; a formation of an amorphous silicon thin film, a laser crystallization, a hydrogenation, and a formation of a gate insulation film are carried out continuously without an exposure to the atmosphere.

Japanese Patent Application Unexamined Publication No. 10-116989; a formation of an amorphous silicon thin film, a laser crystallization, a hydrogenation, and a formation of a gate insulation film are carried out continuously without an exposure to the atmosphere.

Japanese Patent Application Unexamined Publication No. 10-149984; a formation of an amorphous silicon thin film, a laser crystallization, a hydrogenation, and a formation of a gate insulation film are carried out continuously without an exposure to the atmosphere.

Japanese Patent Application Unexamined Publication No. 11-17185; a formation of an amorphous silicon thin film, a laser crystallization, a formation of a gate insulation film, and a formation of a gate electrode are carried out continuously without an exposure to the atmosphere.

The ideas and techniques shown in these publications have been devised so as to solve a problem that, as the surface of silicon formed by a laser crystallization is very active, impurities are easily adhered to the silicon surface when the surface is exposed to the atmosphere, and as a result, characteristics of a TFT are deteriorated or the characteristics are varied.

In order to evaluate the above-described techniques, the applicants have implemented an excimer laser crystallization technique and a silicon oxide thin-film forming technique on the same device (Including conveyance of a substrate to another device without an exposure to the atmosphere), and have compared the performance of a finished product with that manufactured by involving an exposure to the atmosphere. As a result, a large effect has been confirmed in the improvement of a product yield due to the effect of preventing an adhesion of dusts and particles. On the other hand, it has been confirmed that it is also possible to obtain a similar effect to that obtained by increasing the clean level of a clean room environment.

For improving the product yield, there is obtained a largest effect when a substrate cleaning mechanism is built into the same device compared with an effect obtained from the film-forming device. For example, during a film-forming process, particles may be adhered to the surface of the substrate according to a condition of forming a-Si. This required the a-Si to be once released to the atmosphere to have a cleaning process. On the other hand, looking at the performance of a thin-film transistor, there has been no remarkable difference between the manufacturing processes. The reason is considered as follows.

The present applicants have disclosed a fixed oxide film charge density ($10^{11}$ to $10^{12}$ cm$^{-2}$) of a silicon oxide film that is formed by using a plasma at temperatures around 300 to 350° C. and a silicon oxide film formed by a thermal treatment of around 600° C., and an interface state density (up to $6\times10^{10}$ cm$^{-2}$ eV$^{-2}$) between a silicon oxide film and a silicon substrate in the following paper, for example; K. Yuda et al., "Improvement of structural and electrical properties in low-temperature gate-oxides for poly-Si TFTs by controlling O$_2$/SiH$_4$ ratios", Digest of technical papers, 1997 international workshop on active matrix liquid crystal displays, Sep. 11–12, 1997, Kogakuin Univ., Tokyo, Japan, 87 (a publication 5). In this case, a silicon substrate Is generally cleaned by what is called an RCA cleaning using an acid (hated according to the need) cleaning liquid such as sulfuric acid/hydrogen peroxide water, hydrochloric acid/ hydrogen peroxide water/water, ammonium/ hydrogen peroxide water/water, hydrofluoric acid/water. The silicon substrate is then washed and is introduced into a film-forming device. Therefore, the interface state density value is obtained from a sample of a single-crystal silicon substrate that has been clean-interface formed (cleaned) and then exposed to the atmosphere and shifted to a film-forming process.

A trap state density which is the other density of a laser single-crystal silicon film will be focused. The present applicants have disclosed a trap state density ($10^{12}$ to $10^{13}$ cm$^{-2}$) in a crystallized silicon film from a thin-film transistor having a laser crystallized silicon film in, for example, a paper written by H. Tanaka et al., "Excimer laser crystallization of amorphous silicon films", NEC Resource and Development magazine, vol. 35. (1994), 254, (a publication 6). The field-effect mobility of these transistors shows satisfactory characteristics like 40 to 140 cm$^2$/Vsec.

When the trap state density of the silicon film is compared with the interface state density (or a fixed oxide film charge density), it is clear that the trap state density value is larger. In other words, it has been made clear that in order to obtain the effect of cleaning in the sample obtained by forming a silicon film/gate insulation film within the same device without an exposure to the atmosphere, the performance (trap state density) of the silicon film is not sufficient.

As a means for forming a satisfactory gate insulation film by reducing plasma damage in the field relating to the present invention, there has been proposed a remote plasma CVD (chemical vapor deposition) method. For example, a structure having a plasma generating chamber and a substrate processing chamber disposed separately is disclosed in Japanese Patent Application Unexamined Publication No. 5-21393. It is considered possible to achieve the above-described low fixed oxide film charge density ($10^{11}$ to $10^{12}$ cm$^{-2}$) and the low interface state density (up to $6\times10^{10}$ cm$^{-2}$ eV$^{-2}$). However, as described above, there has been a problem that this effect is limited by the performance of the silicon film formed in advance.

SUMMARY OF THE INVENTION

The present invention has been made to overcome the problems described in detail above.

An object of the present invention is to provide a method of forming a semiconductor film having a small trap state density at a desired position on a substrate with reliability.

Another object of the present invention is to provide a method of forming a single-crystal semiconductor film at a desired position on a large-area substrate in good reproducibility.

Still another object of the present invention is to provide a method of forming a single-crystal semiconductor film at a desired position on a substrate so as to form a field effect transistor having a satisfactory semiconductor-insulation film interface or excellent characteristics.

According to the present invention, a method for forming a first-property semiconductor film at a desired position on a substrate, includes the steps of: a) preparing the substrate having a second-property semiconductor film formed thereon; b) preparing an optical mask having a predetermined pattern; c) relatively positioning a projection area of the optical mask at the desired position on the substrate; and d) irradiating the desired position of the second-property semiconductor film with laser light through the optical mask to change an irradiated portion of the second-property semiconductor film to the first-property semiconductor film. The method further includes the step of forming an insulation film on at least the first-property semiconductor film.

The substrate may have an alignment mark previously formed thereon, wherein the alignment mark is used to position the projected area of the optical mask in the step (c). Alternatively, the optical mask has an alignment mark pattern, wherein, in the step (d), an alignment mark corresponding to the alignment mark pattern is formed, wherein the alignment mark is visible due to a difference in optical characteristic between the first-property semiconductor film and the second-property semiconductor film. Therefore, a positioning process after the step (d) can be performed with reference to the alignment mark.

Therefore, a positioning operation can be carried out using the alignment mark, for a photolithography process, an etching process, and a process of removing a part of the laminated film of the semiconductor thin film from the substrate.

Preferably, the first-property semiconductor film is a single-crystal semiconductor film and the second-property semiconductor film is an amorphous semiconductor film.

The method further includes a step of forming an island comprised of the insulation film and the single-crystal semiconductor film by a patterning process, wherein the single-crystal semiconductor film of the island is used for source, drain, and channel regions of a field effect transistor.

Since the single-crystal semiconductor film can be formed by light irradiation at a desired position on a substrate, a field effect transistor such as a thin film transistor for use in a large-area LCD panel can be easily formed at a desired position with reliability.

The present invention also provides a semiconductor thin film structured by a laminated film including a semiconductor thin film that is formed on a substrate and that has a mixture of an area exposed by a light irradiation and an area not exposed by a light irradiation, and an insulation film that has a different component from that of the semiconductor thin film and is formed on the surface of the semiconductor thin film.

Further, the present invention takes a structure that a part of the laminated film has been removed from the substrate.

Further, the present invention takes a structure that the area exposed by a light irradiation and the area not exposed by a light irradiation have different optical colors.

Further, the present invention takes a structure that a predetermined alignment mark is provided on the substrate, and an area determined with reference to this alignment mark can be exposed by a light irradiation. According to the above-described structure, it is possible to form a silicon thin film that has been changed by exposure at a desired position under a desired exposure condition by determining an exposure area with reference to an alignment mark provided in advance.

BRIEF DESCRIPTION OF THE DRAWINGS

FIGS. 2A–2C are timing charts for explaining three conventional operation methods, respectively;

FIG. 12A is a plan view of an example of a mask pattern for explaining an operation of the aligner;

FIG. 12B is a plan view of an exposed silicon film using the mask pattern as shown in FIG. 12A;

FIG. 12C is a sectional view of the substrate having the silicon film exposed by using the mask pattern as shown in FIG. 12A;

FIG. 12D is a plan view of the silicon film subjected to etching after the exposure as shown in FIG. 12B;

FIG. 12E is a sectional view of the substrate having the silicon film exposed by using the mask pattern as shown in FIG. 12A;

DESCRIPTION OF THE PREFERRED EMBODIMENTS

Figure 10:
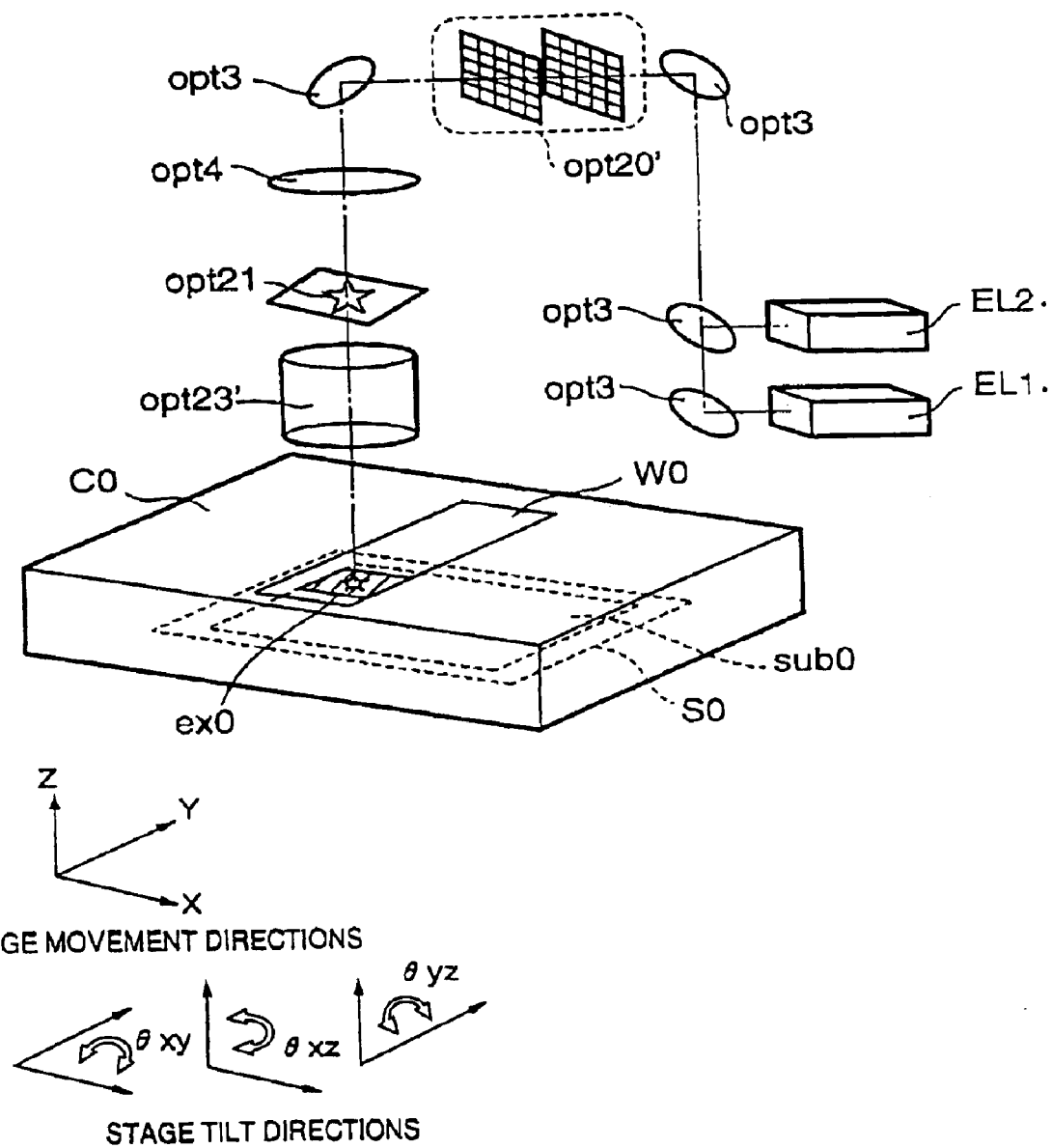
FIG. 10 is a diagram showing a schematic layout of an aligner having a compressed-projection optical system, which is used to form a semiconductor film according to a first embodiment of the present invention.

Referring to FIG. 10, an exposing system or an aligner according to the present invention is provided with a first excimer laser EL1 and a second excimer laser EL2, which are both capable of emitting ultraviolet (UV) pulse beams. The respective beams emitted from the first and second excimer lasers EL1 and EL2 are guided to a homogenizer opt20' via mirrors opt3. The homogenizer opt20' homogenizes a spatial intensity of the beams so that a beam intensity profile becomes in a desired homogeneity, for example, an in-plane distribution ±5% at an optical mask opt21. Original beams supplied from the excimer lasers may have their intensity profiles or total energy changed among pulses. Therefore, it is preferable to provide a mechanism for homogenizing them to avoid variance among pulses. As a homogenizer, a one having a fly eye lens or a cylindrical lens has been generally used.

The beams homogenized by the homogenizer opt20' are guided to the optical mask opt21 via a mirror opt3 and a lens opt4. The optical mask opt21 shapes the beams into a desired pattern and the shaped optical pattern reaches a substrate sub0 disposed within a vacuum chamber C0 via a compressed-projection optical system opt23' and a laser beam introduction window W0. In other words, the substrate sub0 is irradiated with the laser beams defined by the optical pattern of the optical mask opt21.

The substrate sub0 is mounted on a substrate stage S0 in the vacuum chamber C0. It is possible to irradiate the optical pattern on a desired area (here, a pattern transfer area ex0) by operating the substrate stage S0.

Figure 1:
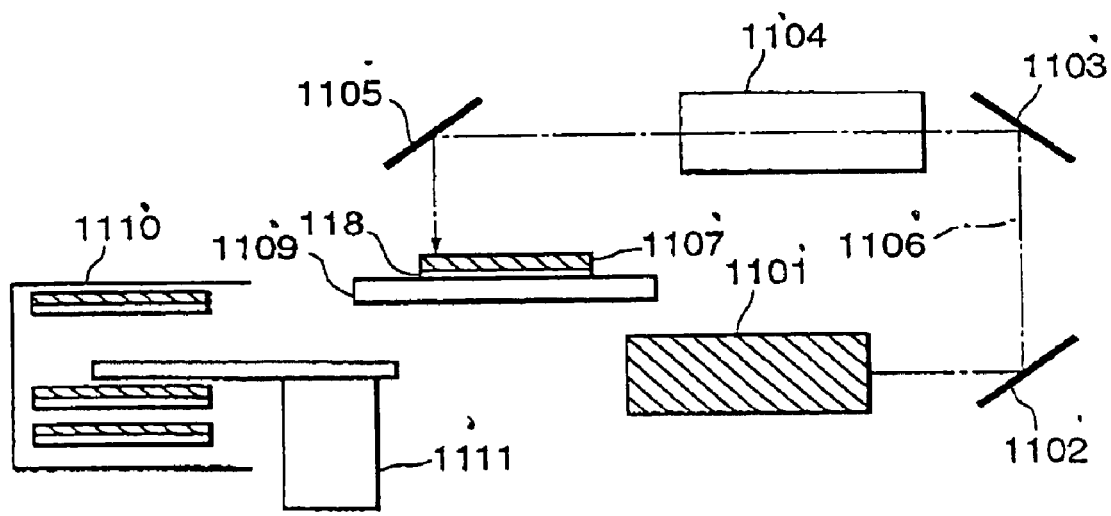
FIG. 1 is a schematic view showing one example of a structure of a conventional pulse laser beam irradiator.
Figure 3:
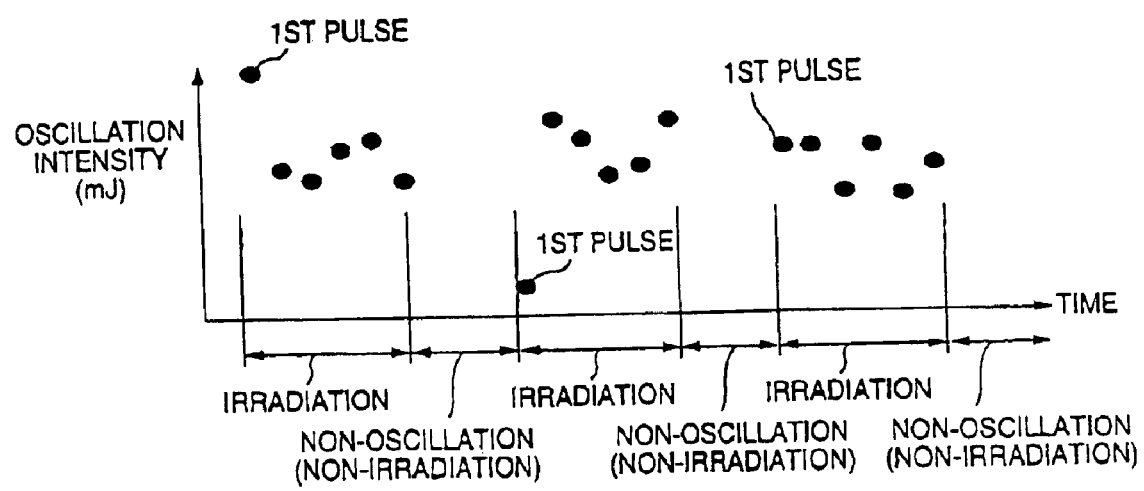
FIG. 3 is a diagram for explaining one example of a distribution of intensities of continuous laser beam pulses.
Figure 4:
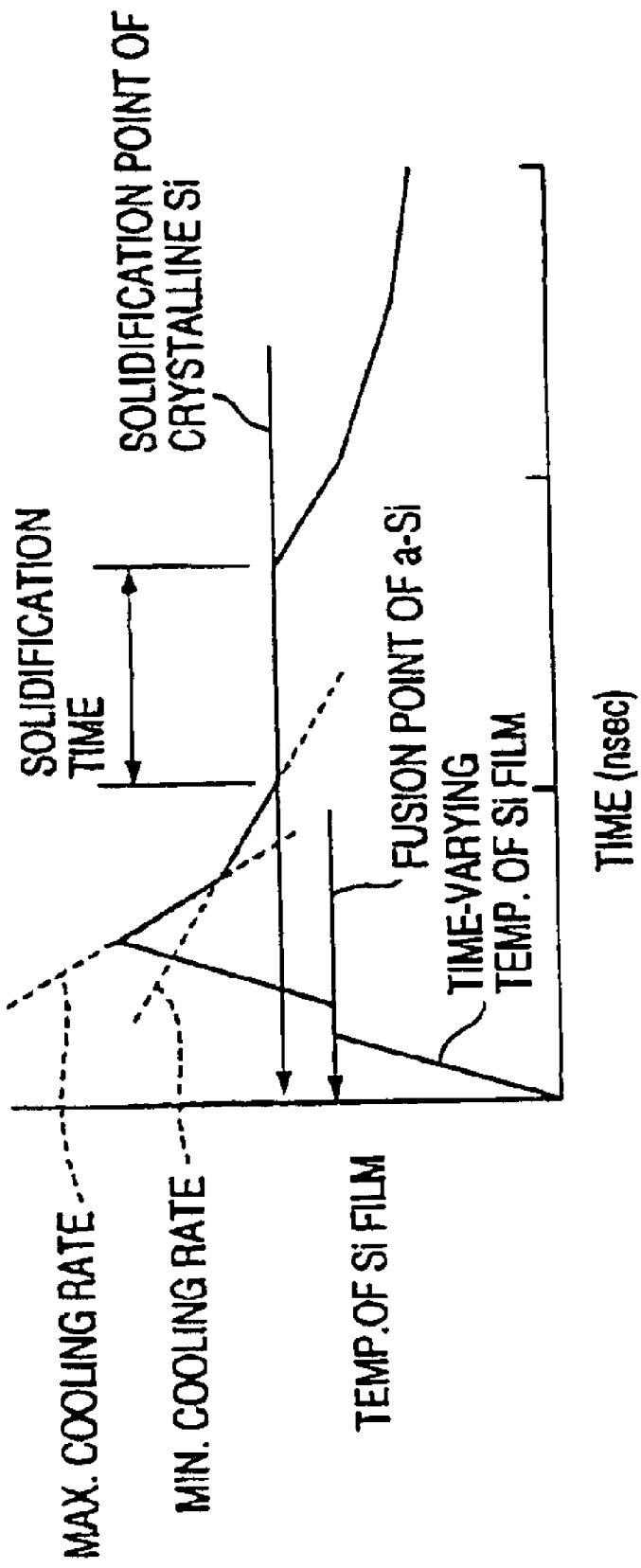
FIG. 4 is a graph showing a temperature change of a silicon film with respect to time.
Figure 5:
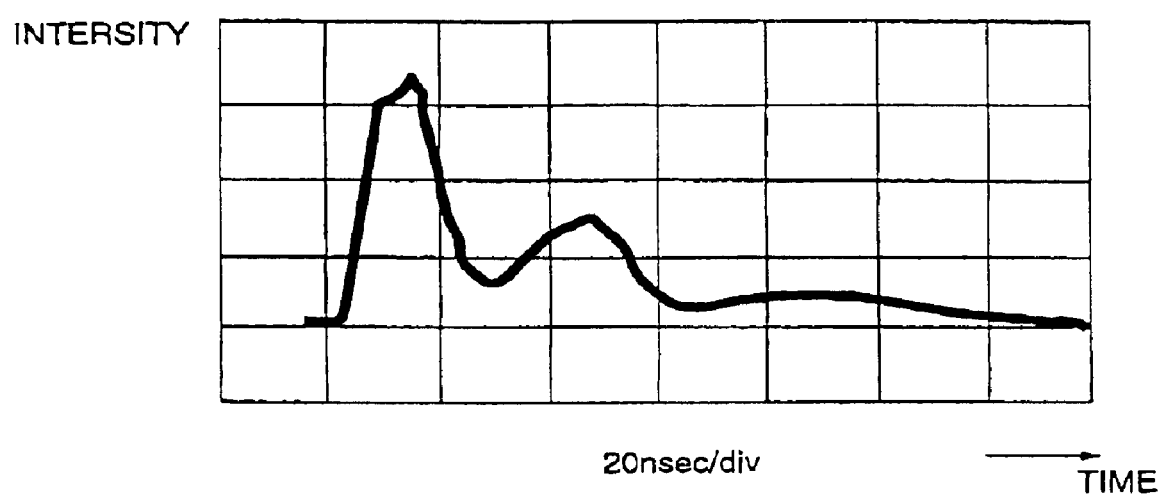
FIG. 5 is a waveform diagram showing a laser beam pulse intensity waveform.
Figure 6:
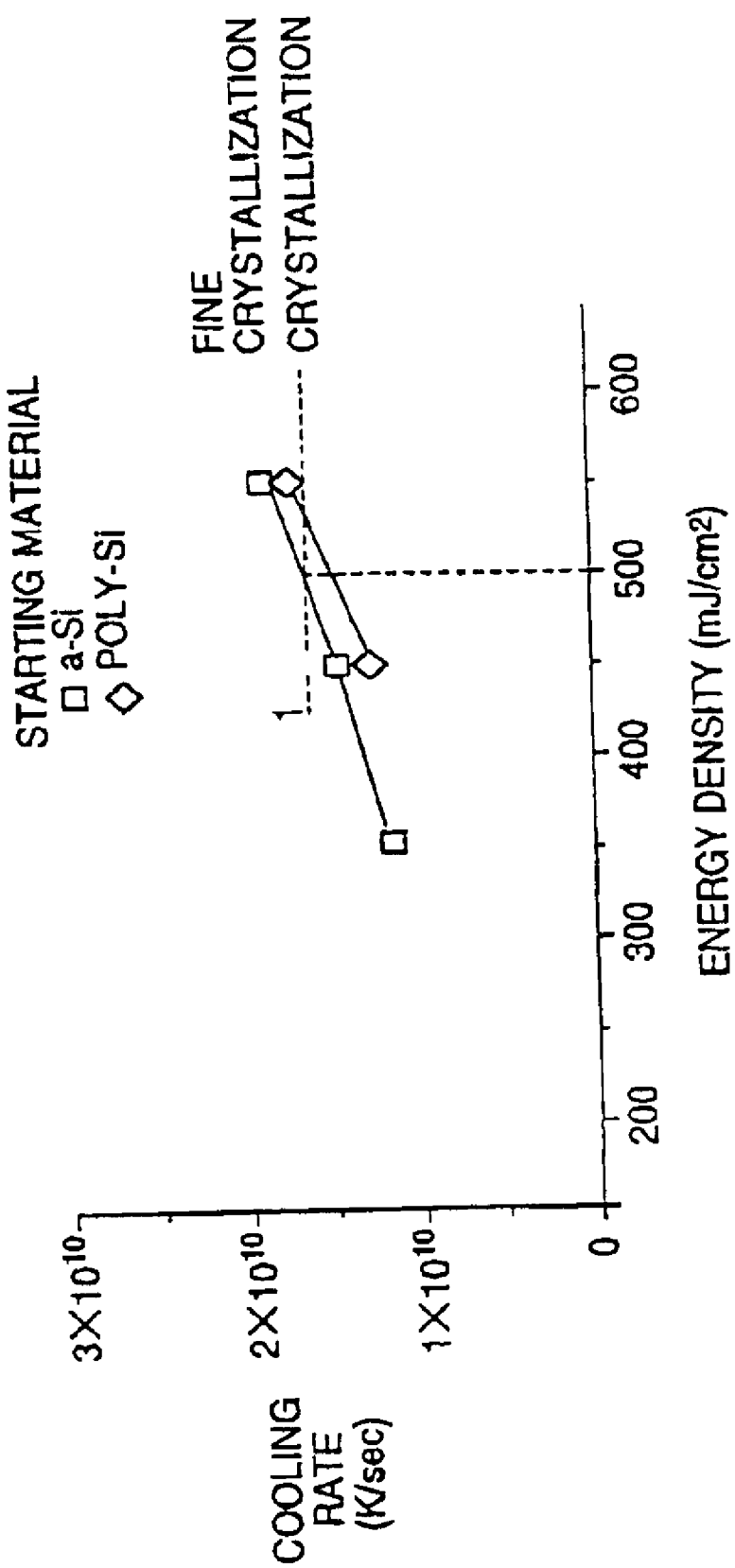
FIG. 6 is a diagram showing one example of a relationship between irradiation intensity and cooling rates.
Figure 7:
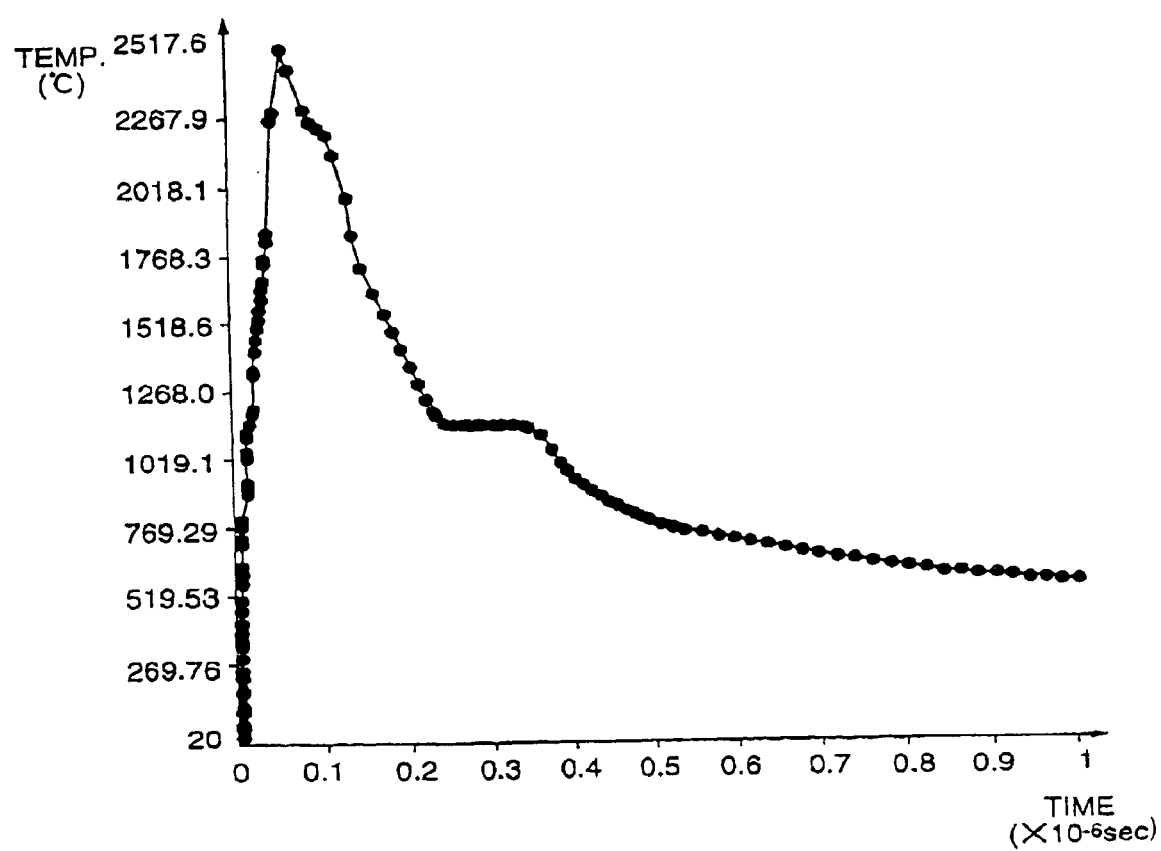
FIG. 7 is a diagram showing an example of experimental values of a silicon thin film temperature change.
Figure 8:
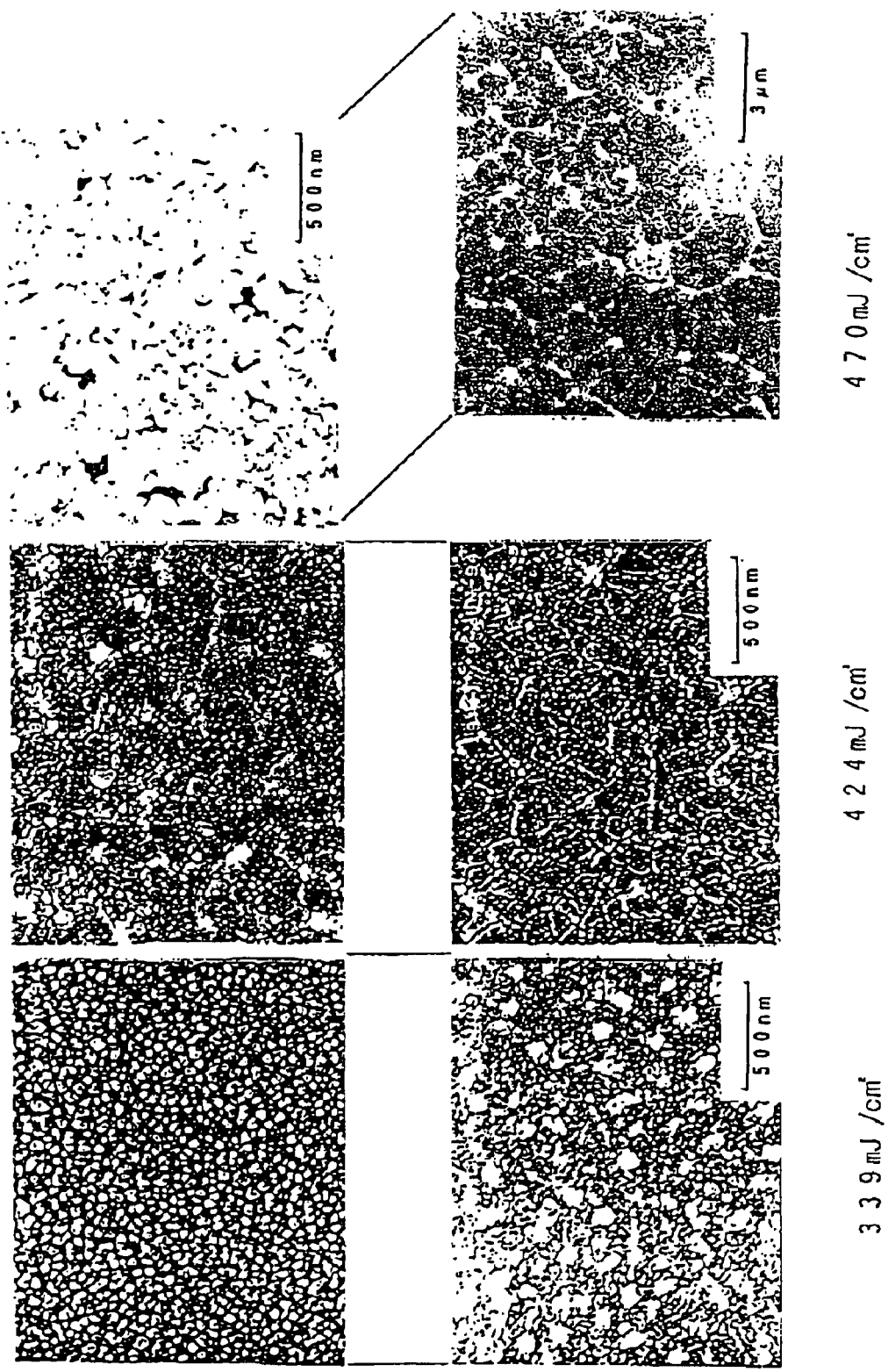
FIG. 8 shows electronic microscope pictures for explaining a crystal state of a laser recrystallized silicon thin film corresponding to each irradiation intensity and number of irradiation.
Figure 9:
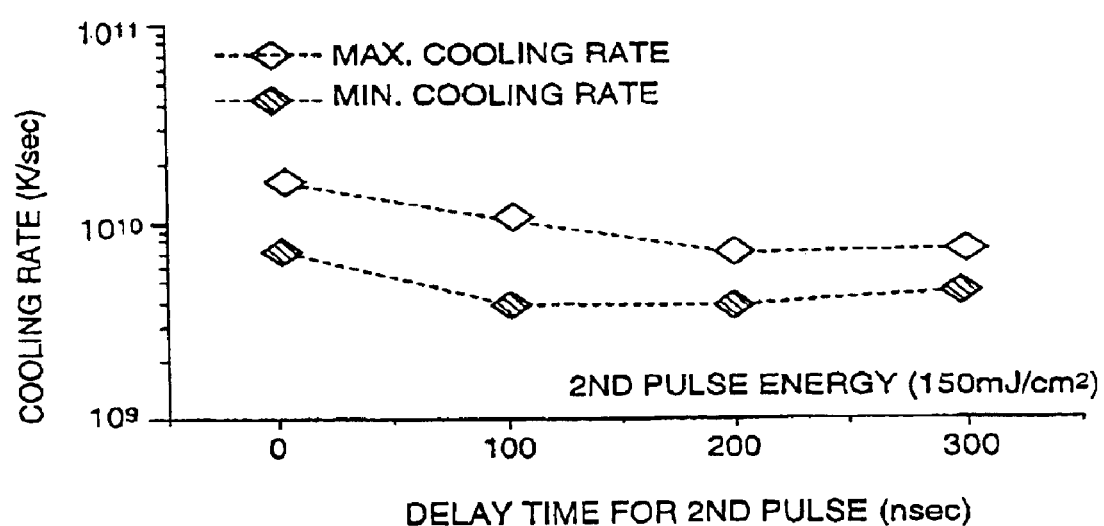
FIG. 9 is a diagram showing a maximum cooling rate and a cooling rate near a solidification point after a second pulse has been input.

Although the compressed-projection optical system opt23' is provided in FIG. 1, it is possible to carry out a projection in the equal magnification or an enlarged magnification when the condition matches. A laser beam irradiation is carried out on a desired area on the substrate sub0 by operating the substrate stage S0 in X-Y directions. The optical mask opt21 is mounted on a mask stage (not shown). It is also possible to operate the beam which is irradiated onto a desired surface of the substrate by moving the optical mask opt21 when the moving range is within the area where an exposure is possible.

A mechanism necessary for irradiating a desired optical pattern onto a substrate under a desired condition will be explained next.

For adjusting an optical axis, a fine adjustment is necessary. Therefore, in order to avoid a repeated adjustment, there will be explained a method of adjusting a position of the substrate by fixing a once-adjusted optical axis. For setting a substrate irradiation surface with respect to an optical axis, it is necessary to correct a position in a focus direction (Z) and a degree of the perpendicular with respect to an optical axis. Therefore, among a θxy-tilt correction direction, a θ xz-tilt correction direction, a θyz-tilt correction direction, an exposure area moving direction X, an exposure area moving direction Y, and a focusing direction Z as shown in FIG. 10, the perpendicular degree with respect to an optical axis is corrected by adjusting the θxy-tilt correction direction, the θxz-tilt correction direction, and the θyz-tilt correction direction. Further, by adjusting in the focusing direction Z, it is possible to control so that the substrate irradiation surface is disposed at a position that matches the depth of focus of the optical system.

Figure 11:
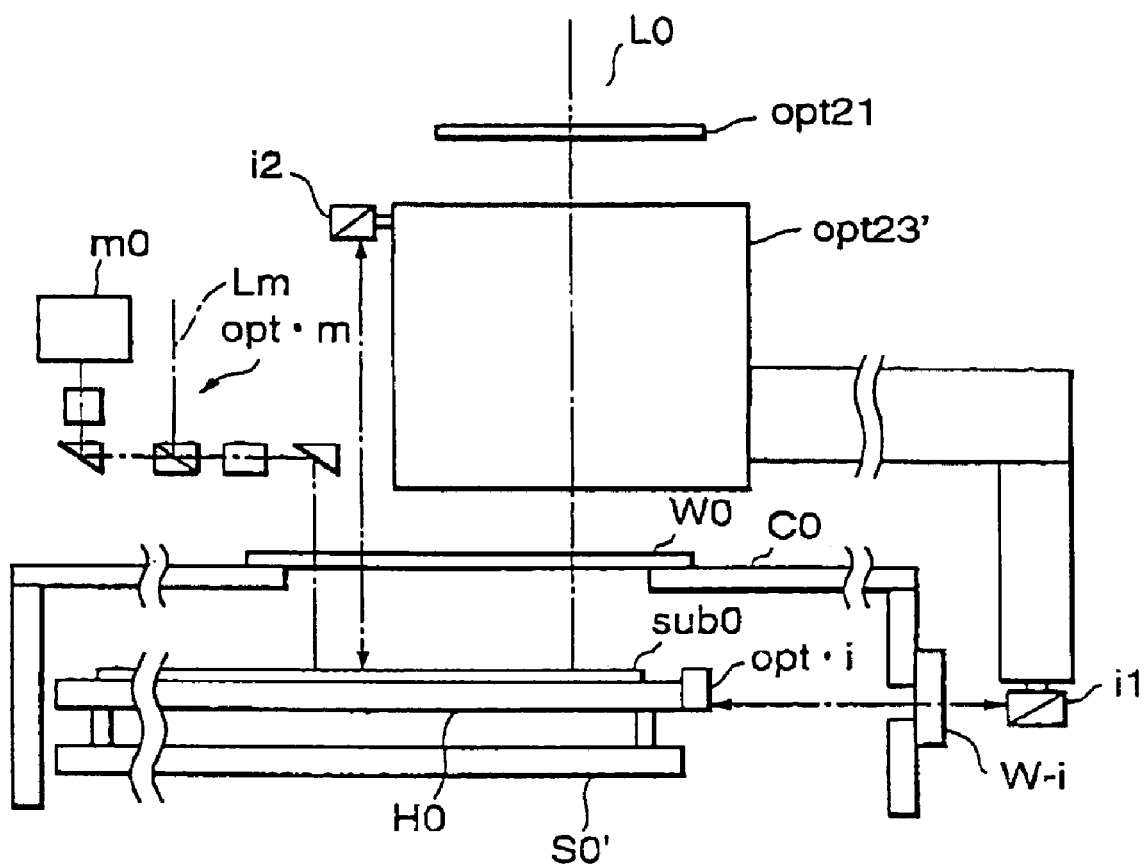
FIG. 11 is a diagram showing a structure of an alignment mechanism in the aligner of FIG. 10.

FIG. 11 shows an alignment mechanism of the substrate sub0. The optical mask opt21, the compressed-projection optical system opt23, and the laser beam introduction window W0 are disposed in parallel in sequence along an exposure axis L0, as shown in FIG. 11. The substrate sub0 disposed within the vacuum chamber C0 is disposed on a heater having a substrate adsorbing mechanism H0 and above a XYZ-θxy, θxz, θyz stage S0'. Although a vacuum chamber is used, it is preferable that an actual optical irradiation is carried out In an atmosphere of an inert gas, hydrogen, oxygen or nitrogen that has been displaced and filled after a vacuum exhaust. The pressure of this gas atmosphere may be around the atmospheric pressure.

When the heater having a substrate adsorbing mechanism H0 is used, it is possible to set a substrate heating condition to within a range around a room temperature to 400° C. at the time of light irradiation. When the gas pressure is set to around the atmospheric pressure, it is possible to adsorb the substrate by a vacuum chucking function. Therefore, it is possible to prevent a deviation even if the substrate stage has moved within the chamber. Further, even if there is some camber or a flexure on the input substrate, the substrate can be securely fixed to the substrate stage. Further, it is also possible to restrict a deviation of the depth of focus due to a camber or a flexure of the substrate caused by the heating to a minimum.

In FIG. 11, laser beam interferometers i1 and i2 carry out an alignment and a precision measurement of a Z-direction position of the substrate via a length-measuring window W-i and a length-measuring mirror opt-i. For carrying out the alignment, an alignment mark provided on the substrate is measured by using an off-axis microscope m0, a microscope light source Lm and a microscope element opt-m. A desired exposure position can be measured by using substrate position information from the laser beam interferometers.

Although the application of the "Off-axis Method" is shown in FIG. 11, it is also possible to apply the "Through The Lens Methods" and the "Through The Mask (Reticle) Method". It is also possible to use a method of averaging measurement errors occurring at the time of measuring, by determining linear coordinates from a plurality of measuring points using the method of least squares.

FIGS. 12A–12E are explanatory views showing a relationship between a mask pattern and an alignment mark. A mask is structured by a non-exposing portion mask1 and an exposing portion mask2. When an excimer laser Is used as a light source, for example, a metal like aluminum, chrome or tungsten and a film that absorbs and reflects ultraviolet rays like a dielectric multi-layer film are formed on a quartz substrate through which ultraviolet rays are transmitted. Then, a predetermined pattern is formed by using photolithography and an etching technique. Ultraviolet rays are irradiated onto a silicon film according to a desired transmission pattern (a white portion in FIG. 12A) on the mask, and an exposed Si portion si2 is formed within a non-exposed Si Si1 as shown in FIG. 12B. In the case of a mark (mark2) previously formed on the substrate sub0 as shown in FIGS. 12B and 12C, beams are irradiated after an alignment adjustment so that a mark (mark1) on the mask matches the mark2. This makes it possible to irradiate beams onto only a specific area (position) designed in advance on the silicon thin film.

In the thin-film-transistor forming process using the silicon thin film, at a first stage (a first process) where the exposure process requires a positioning (that is, when an alignment mark has not yet been formed in advance), when an exposure forming mark (mark3) is exposed at the same time as when beams are irradiated onto the silicon thin film, it is possible to form an alignment mark utilizing an optical difference between a-Si and crystalline Si. An alignment mark that can sufficiently function for practical application can be obtained based on a hue difference between the a-Si and the crystalline Si.

Using the alignment mark obtained in the above manner, a photolithography or the like is carried out in the later process. Therefore, it is possible to sequentially obtain transistors, desired mechanisms, or function blocks by accurately positioning in a single-crystalline area that has been exposed to the beams. FIGS. 12D and 12E show a state that a Si oxide film has been formed on the silicon thin film after the exposure process, and a desired area of the silicon layer has been removed by etching. A Si-removed area Si3 is an area where a laminated silicon film and a Si oxide film have been removed by etching. A Si oxide film Si5 has been laminated on the non-exposed Si portion Si1 and the exposed Si portion Si2. By forming an island-shaped structure consisting of a silicon film covered with the oxide film, it is possible to form channel source and drain areas of thin-film transistors that are electrically separated from each other and a mark that is necessary for the alignment at later processes.

Figure 13A:
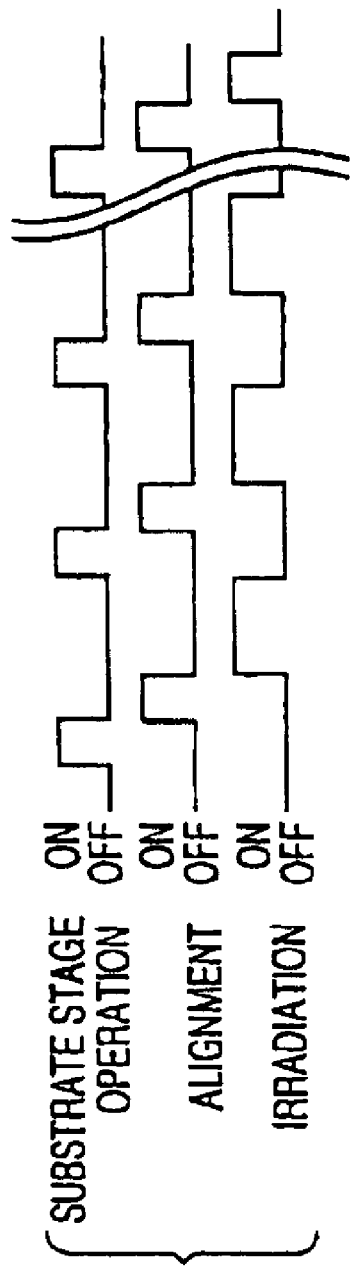
FIG. 13A is a timing chart of a first example of control operation in the aligner.

Referring to FIG. 13A, the substrate is moved to a desired exposure position by operating the substrate stage. Next, the focusing and alignment adjustment are carried out to fine-adjust the exposure position. In this case, the adjustment is carried out within a desired set error precision of about 0.1 μm to 100 μm, for example. After this positional adjustment has been completed, a light irradiation onto the substrate is carried out. At point of time when a series of these operations have been finished, the substrate is moved to match the next exposure position. Then, beams are irradiated onto all the necessary positions on the substrate. After finishing the irradiation onto all the necessary positions, the substrate is replaced with the next one, and a series of similar predetermined operations are carried out on the next substrate.

Figure 13B:
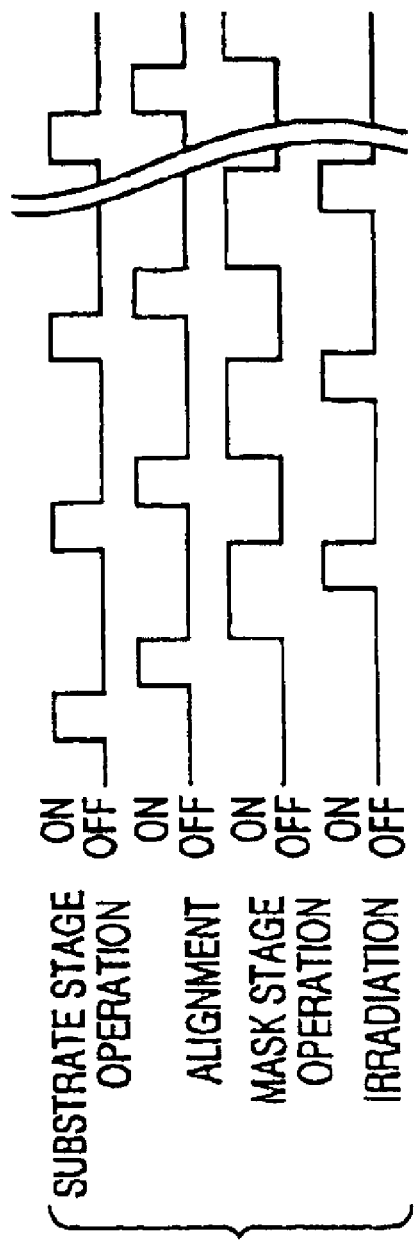
FIG. 13B is a timing chart of a second example of control operation in the aligner.

Referring to FIG. 13B, after the substrate is moved to a desired exposure position by operating the substrate stage, the focusing and alignment adjustment are carried out to fine-adjust the exposure position. In this case, the adjustment is carried out within a desired set error precision of about 0.1 μm to 100 μm, for example. After this operation has been completed, a move of the mask stage is started. In this control procedure, in order to avoid a variance in a move step at the starting time, a light irradiation onto the substrate is started after the mask stage movement has been started. Since beams are irradiated onto a position apart from the alignment position based on the move of the stage, it is of course needless to mention that it is necessary to take into account the offset in advance.

It is also possible to start the operation of the light source earlier than the light irradiation onto the substrate, then open the shutter and carry out the light irradiation onto the substrate at a point of time when the output intensity of the light source has been stabilized. It has been known that the first several tens of pulses are particularly unstable in the case of such a control method that an excimer laser is used as a light source and the oscillation period and the stop period are repeated. When it is not desired to irradiate these unstable laser beam pulses, it is possible to take a method of interrupting beams in synchronization with the operation of the mask stage. At point of time when a series of these operations have been finished, the substrate is moved to the next exposure position. Then, beams are irradiated onto all the necessary positions on the substrate. After finishing the irradiation onto all the necessary positions, the substrate is replaced with the next one, and a series of similar predetermined operations are carried out on the next substrate.

An experimental example will be described. Beams of 2 μm×50 μm have been irradiated onto an a-Si thin film having a film thickness 75 nm to scan the film in a short axis direction at a pitch of 0.5 μm. One light source is used, and a laser beam irradiation intensity is set to 470 mJ/cm$^2$ on an irradiated surface. As a result, a single-crystal silicon thin film continuous in a scanning direction has been obtained. Further, a second light source is used and a laser beam irradiation intensity is set to 150 mJ/cm$^2$ on an irradiated surface. The second beam has been irradiated by delaying 100 nsec. As a result, a single-crystal silicon thin film continuous in a scanning direction has also been obtained even under a scanning pitch condition of 1.0 μm. A trap state density in the crystallized silicon film showed a lower value than $10^{12}$ cm$^{-2}$.

Figure 14:
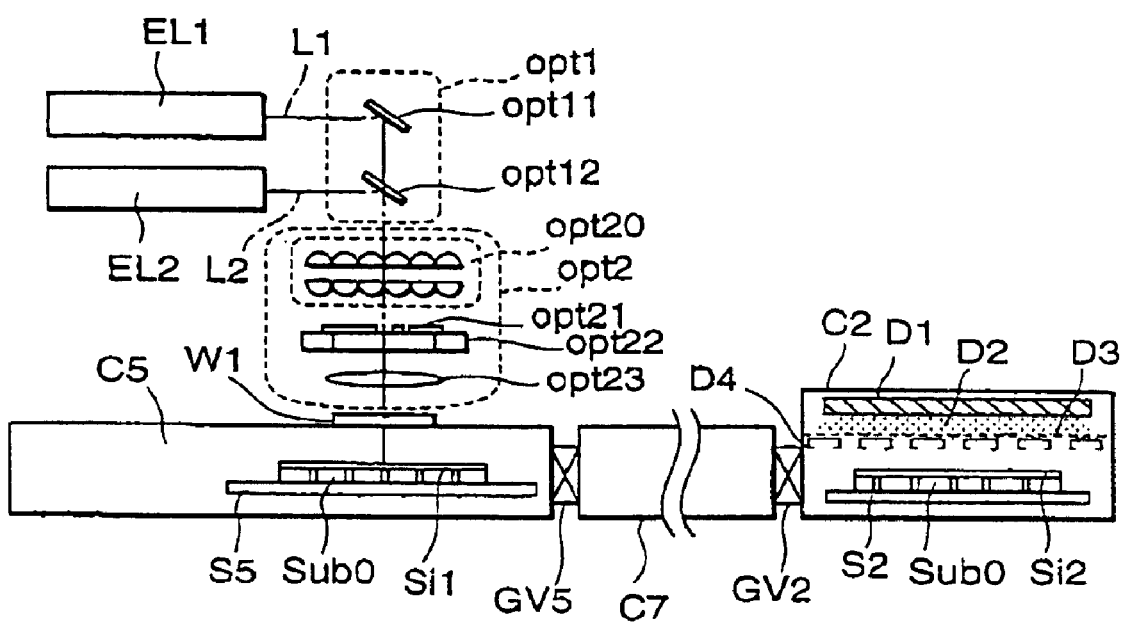
FIG. 14 is a side cross-sectional view of a semiconductor thin-film forming system, which is used to form a thin film transistor according to the present invention.

Referring to FIG. 14, a semiconductor thin-film forming device is constructed of a plasma CVD chamber C2, a laser beam irradiation chamber C5 and a substrate carrying chamber C7. It is possible to carry a substrate via gate valves GV2 and GV5 under an atmosphere of an inert gas, nitrogen, hydrogen or oxygen in vacuum, and also in a high-vacuum state, or at a reduced pressure or at an increased pressure, without exposing the substrate to the atmosphere outside the device. In the laser beam irradiation chamber C5, the substrate is placed on a substrate stage S5 that can be heated up to about 400° C. by using a chucking mechanism.

In the plasma CVD chamber C2, the substrate is placed on a substrate holder S2 that can be heated up to about 400° C. This example shows a state that the substrate has been guided into the laser beam irradiation chamber C5 in a state that a silicon thin film Si1 has been formed on a glass substrate Sub0, the silicon thin film Si1 has been changed into a crystalline silicon thin film Si2 by irradiating laser beams onto a desired area thereof, and the substrate Sub0 having the crystalline silicon thin film thereon has been carried to the plasma CVD chamber C2.

Laser beams introduced into the laser beam irradiation chamber C5 are guided as follows. Beams emitted from an excimer laser EL1 and an excimer laser 2 EL2 are each indicated by a first beam line L1 and a second beam line L2. The beams reach a substrate surface via a laser beam combining optical device opt1 composed of a mirror opt11 and a transmission mirror opt12, a laser beam irradiation optical device opt2 composed of a homogenizer opt20, an optical mask opt21 fixed to an optical mask stage opt22, a projection optical device opt23, and a laser beam introduction window W1 provided on the laser beam irradiation chamber C5. Although two excimer lasers are shown in this example, it is also possible to install a desired number of excimer lasers (at least one excimer laser) as a light source. The light source is not limited to the excimer laser, but it is also possible to supply light in a pulse state by using a pulse laser such as a $CO_2$ gas laser, a YAG laser or a combination of a CW light source such as an argon laser and a high-speed shutter.

On the other hand, in the plasma CVD chamber C2, a plasma D2 is formed by an RF electrode D1 and a plasma closing electrode D3 at a position away from an area where the substrate is disposed. It is possible to form a silicon oxide film on the substrate by supplying a silane gas to the plasma generating area by using, for example, oxygen and helium and a material gas introducer D4.

Figure 15:
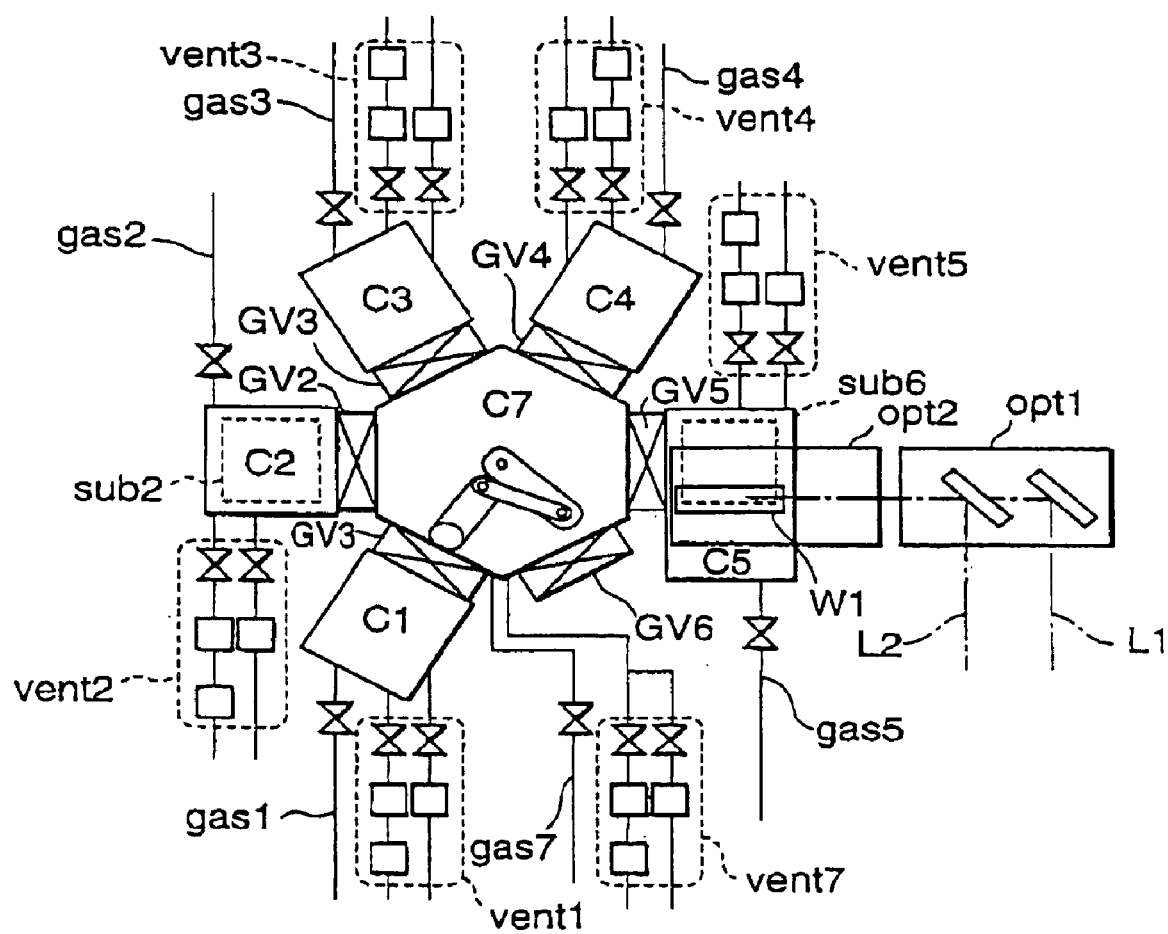
FIG. 15 is a top plan view of the semiconductor thin-film forming system of FIG. 14.

Referring to FIG. 15, a load/unload chamber C1, a plasma CVD chamber C2, a substrate heating chamber C3, a hydrogen plasma processing chamber C4, a laser beam irradiation chamber C5, and a substrate carrying chamber C7 are connected together is via gate valves GV1 to GV6, respectively. Laser beams supplied from the first beam line L1 and the second beam line L2 are irradiated onto the substrate surface via the laser beam combining optical device opt1, the laser beam irradiation optical device opt2 and the laser beam introduction window W1. The respective process chambers and carrying chambers have gas introduction devices gas1 to gas7 and ventilators vent1 to vent7 connected to them respectively, so that a supply of a desired kind of gas, a setting of a process pressure, and ventilation and vacuum are adjusted. As shown by dotted lines, substrates sub6 and sub2 are disposed in the laser beam irradiation chamber C5 and the plasma CVD chamber C2, respectively.

Figure 16:
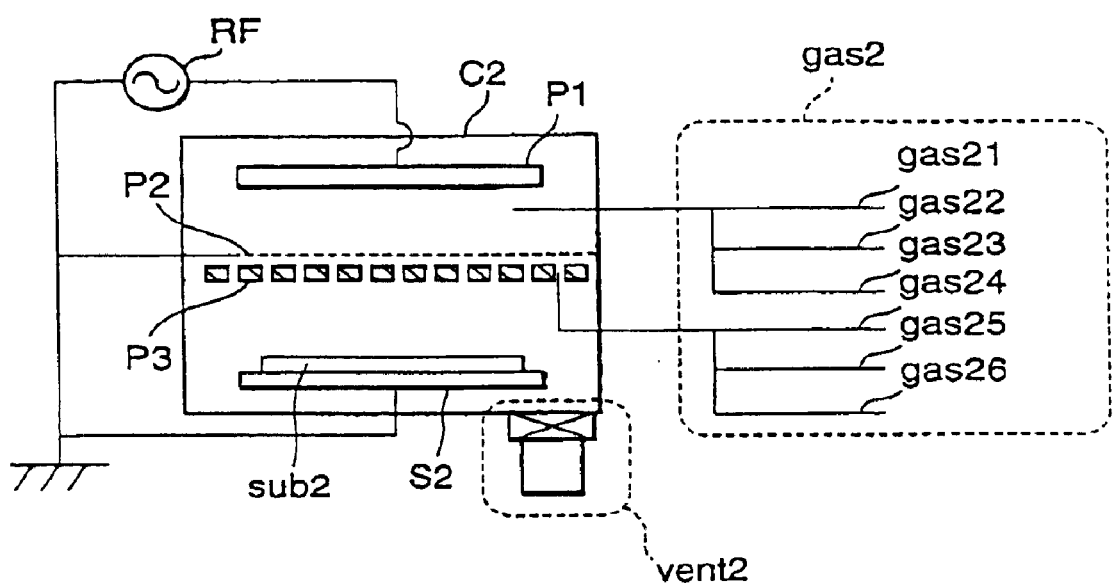
FIG. 16 is a diagram schematically showing a structure of a plasma CVD chamber in the semiconductor thin-film forming system of FIG. 14.

Referring to FIG. 16, electric power that is preferably a frequency of 13.56 MHz or above is supplied from a high-frequency power source RF to a high-frequency electrode P1. Plasma is formed between the high-frequency electrode P1 and an electrode P2 having gas supplying holes. Reactively-generated radicals pass through the electrode P2 having the gas supplying holes and are guided to an area where a substrate is disposed. A separate gas Is introduced by a plane gas introducer P3 without being exposed to the plasma, and a thin film is formed on a substrate sub2 by chemical vapor deposition. A substrate holder S2 is designed to be heated to a room temperature to about 500° C. by a heater or the like. As shown in FIG. 16, a silicon oxide film can be formed by reacting oxygen radicals with a silane gas by operating the ventilator ven2, the gas introducer gas2, an oxygen line gas21, a helium line gas22, a hydrogen line gas23, a silane line gas24, a helium line gas25, and an argon line gas26.

A film has been formed under condition of a substrate temperature 300° C., a pressure 0.1 torr, RF power 100 W, a silane flow rate 10 sccm, an oxygen flow rate 400 sccm, and a helium flow rate 400 sccm. As a result, it has been showed that it is possible to form a silicon oxide film having satisfactory characteristics of a fixed charge density of Silicon oxide film ($5 \times 10^{11}$ $cm^{-2}$). When the oxygen flow rate is set higher than the silane flow rate, it is possible to form a satisfactory oxide film. As the plasma CVD chamber, instead of using the parallel plate RF plasma CVD device, it is also possible to use a method not utilizing a plasma such as a reduced-pressure CVD or a normal-pressure CVD, or a plasma CVD method using microwaves or ECR (Electron Cycrotron Resonance) effect.

The following table 1 shows an example of kinds of gas that are necessary when the plasma CVD device shown in FIG. 16 is used for forming a thin film other than a silicon oxide film.

TABLE 1

|  | SiO2 | Si3N4 | Si | Si | Hydrogenizing |
|---|---|---|---|---|---|
| Gas21 | O2 | N2 |  |  |  |
| Gas22 | He | Ar |  | Ar |  |
| Gas23 |  |  | H2 | H2 | H2 |
| Gas24 | SiH4 | SiH4 | SiH4 |  |  |
| Gas25 | He | Ar |  | Ar |  |
| Gas26 |  |  |  | SiF4 |  |

For forming a silicon nitride film ($Si_3N_4$), it is possible to use $N_2$ (nitrogen) (or ammonium) and Ar (argon) as its carrier gas, and $SiH_4$ (silane) and Ar (argon) as its carrier gas. For forming a silicon thin film, it is possible to use material gases such as $H_2$ (hydrogen) and silane, or hydrogen and Argon as its carrier gas and $SiF_4$ (silanetetrafluoride and argon as its carrier gas). It is also possible to carry out a hydrogen plasma processing of a silicon thin film or a silicon oxide film by utilizing a hydrogen plasma, although this is not a film-forming process.

FIGS. 17A–17G show a TFT forming process according to a semiconductor thin-film forming method of the present invention.

Figure 17A:
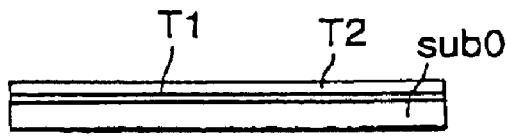
FIGS. 17A–17G are process flow diagrams showing a manufacturing process of a thin-film transistor according to a second embodiment of the present invention.

Referring to FIG. 17A, on a glass substrate sub0 from which organic materials, metals and fine particles have been removed by cleaning, a substrate cover film T1 and a silicon thin film T2 are sequentially formed. As the substrate cover film, a silicon oxide film is formed by 1 $\mu$m at 450° C. using silane and an oxygen gas as materials by the LPCVD (low-pressure chemical vapor deposition) method. By using the LPCVD method, it is possible to cover a whole outer surface of the substrate excluding the substrate holding area (not shown). It is also possible to utilize plasma CVD using TEOS (tetraethoxysilane) and oxygen as materials, a normal-pressure CVD using TEOS and ozone as materials, or the plasma CVD as shown in FIG. 16. A material that can prevent a dispersion of impurities that are harmful for a semiconductor device and are included in a substrate material (a glass having an alkali metal concentration that has been reduced to a minimum, a quartz glass of which surface has been ground, etc.) is effective as a substrate cover film. A silicon thin film is formed in a thickness of 75 nm at 500° C. by using a disilane gas as a material by the LPCVD. In this case, a hydrogen atom density included in the film becomes 1 atom % or below. Therefore, it is possible to prevent a roughening of the film due to a discharge of hydrogen in the laser beam irradiation process. It is also possible to form a silicon thin film having a low hydrogen atom density by adjusting a substrate temperature, a hydrogen/silane flow rate ratio, a hydrogen/silanetetrafluoride flow rate ratio, etc. based on the plasma CVD method shown in FIG. 16 or a widely used plasma CVD method.

Figure 17B:
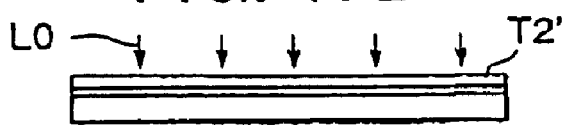

Referring to FIG. 17B, the substrate prepared in the above process is cleaned for removing organic materials, metals, fine particles and surface oxide film. Then, the substrate is introduced Into the thin-film forming device of the present invention. A laser beam L0 is irradiated onto the silicon thin film to reform the film into a crystallized silicon thin film T2'. The laser crystallization Is carried out in the atmosphere of a high-purity nitrogen of 99.9999% or above at 700 torr or above.

Figure 17C:
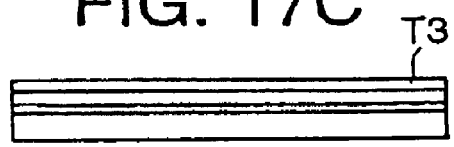

Referring to FIG. 17C, after exhausting gas, the substrate after finishing the above process is conveyed to a plasma CVD chamber via a substrate carrying chamber. As a first gate insulation film T3, a silicon oxide film is deposited to have a film thickness of 10 nm at a substrate temperature 350 degrees using silane, helium and oxygen as material gases. Then, as necessary, the hydrogen plasma processing or heat annealing is carried out. The processing up to this stage is carried out by the thin-film forming device of the present invention.

Figure 17D:
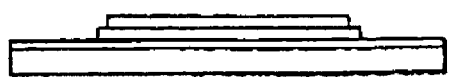

Referring to FIG. 17D, an island of a laminated film of a silicon thin film and a silicon oxide film is formed by using photolithography and etching process. It is preferable to select an etching condition that an etching rate of a silicon oxide film is higher than that of a silicon thin film. As described later, it is possible to provide a thin-film transistor having high reliability that can prevent a gate leakage, by forming pattern cross sections in step-like shape (or in a tapered shape).

Figure 17E:
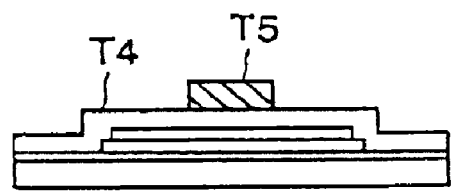

Referring to FIG. 17E, the substrate is cleaned to remove organic materials, metals and fine particles. Then, a second gate insulating film T4 is formed to cover the islands. In this case, a silicon oxide has been formed to have a film thickness of 30 nm at 450° C. by using silane and an oxygen gas as material gases by the LPCVD method. It is also possible to utilize a plasma CVD using TEOS (tetraethoxysilane) and oxygen as materials, a normal-pressure CVD using TEOS and ozone as materials, or a plasma CVD as shown in FIG. 16. Next, as a gate electrode, a n+ silicon film is formed by 80 nm and a tungsten silicide film is formed by 110 nm. It is preferable that the n+ silicon film is a crystalline phosphorus-doped silicon film formed by using plasma CVD or LPCVD method. Then, a patterned gate electrode T5 is formed via photolithography and etching process.

Figure 17F:

Referring to FIG. 17F, impurity injection areas T6 are formed by using the gate electrode T5 as a mask. In the case of forming a CMOS type circuit, an n-channel TFT that requires an n+ area and a p-channel TFT that requires a p+ area are formed separately by using photolithography. It is possible to employ a method such as an ion doping method that does not carry out a mass separation of injected impurity ion, an ion injection method, a plasma doping method, a laser doping emthod, etc. In this case, an impurity is introduced after this film has been removed from the surface. Depending on a usage or an impurity introducing method, an impurity is introduced in a state that a silicon oxide film is left on the surface or after this film has been removed from the surface.

Figure 17G:
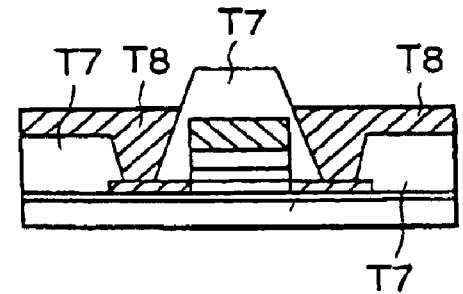

Referring to FIG. 17G, inter-layer separation insulation films T7 are deposited, and contact holes are opened. Then, metals are deposited, and metal interconnections T8 are formed by photolithography and etching process. As an inter-layer separation insulation film, it is possible to use TEOS oxide film, silica coating film or organic coating film that can be formed in a planar shape. The contact holes are formed by photolithography and etching process. For a metal line for wiring, aluminum or copper that has low resistance, or an alloy metal produced by alloying these metals, or a high-fusing point metal such as tungsten or molybdenum can be used. Based on the above-described processes, it is possible to form high-performance and high-reliability thin-film transistors.

Figure 18A:
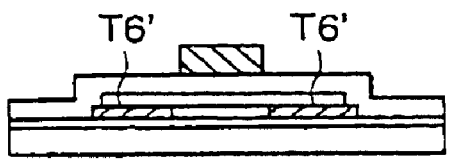
FIGS. 18A and 18B are process flow diagrams showing another example of the manufacturing process of a thin-film transistor according to the second embodiment of the present invention.

Referring to FIG. 18A, after the patterned gate electrode T5 has been formed as shown in FIG. 17E, impurity injection areas T6' are formed by using the gate electrode T5 as a mask in a state that a silicon oxide film is left on the surface.

Figure 18B:
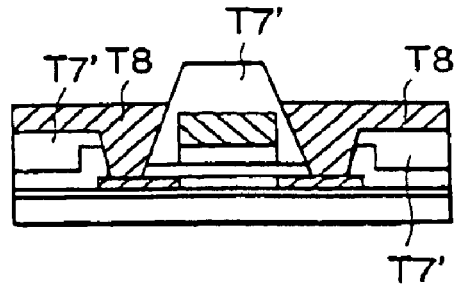

Referring to FIG. 18B, inter-layer separation insulation films T7' are deposited, and contact holes are opened. Then, metals are deposited, and metal interconnections T8 are formed by photolithography and etching process.

Figure 19A:
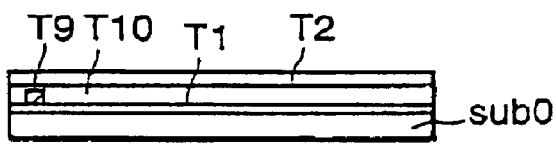
FIGS. 19A–19G are process flow diagrams showing a manufacturing process of a thin-film transistor according to a third embodiment of the present invention.
Figure 19B:
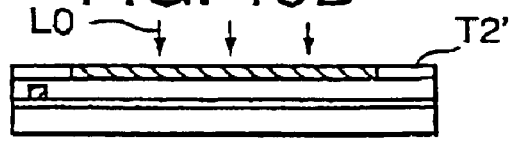
Figure 19C:
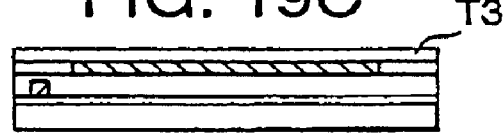
Figure 19D:
Figure 19E:
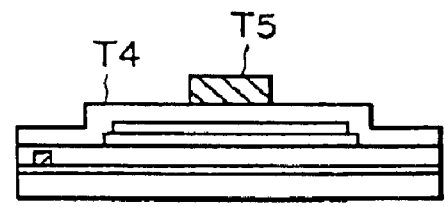
Figure 19F:
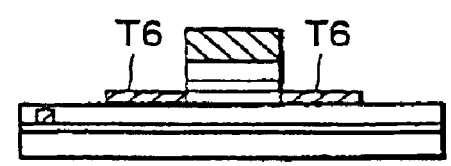
Figure 19G:
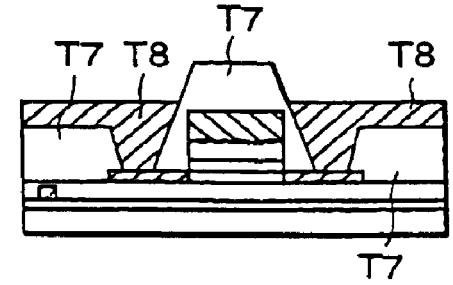
Figure 20A:
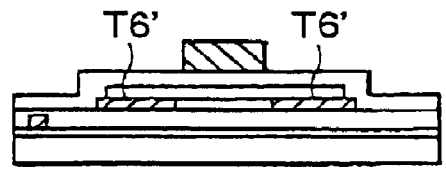
FIGS. 20A and 20B are process flow diagrams showing another example of the manufacturing process of a thin-film transistor according to the third embodiment of the present invention.
Figure 20B:
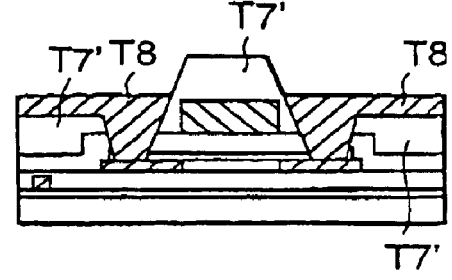

FIGS. 19 and 20 show the case that an alignment mark has been provided in advance and a laser beam irradiation is carried out according to the alignment mark. FIGS. 21 and 22 show the case that an alignment mark is formed at the same time when a laser beam is irradiated. Basically, the process is similar to that as shown in FIGS. 17 and 18. Therefore, only different points will be mainly explained.

Referring to FIG. 19A, on a glass substrate sub0 from which organic materials, metals and fine particles have been removed by cleaning, a substrate cover film T1 and a tungsten silicide film are sequentially formed. An alignment mark T9 is formed by patterning the tungsten silicide film using photolithography and etching. Next, for protecting the alignment mark T9, a mark protecting film T10 is formed and thereafter a silicon thin film T2 is deposited.

Referring to FIG. 19B, at the time of irradiating a laser beam, a desired area is exposed with the laser beam by using the alignment mark to position the laser beam. Then, it is possible to carry out the next alignment using the alignment mark T9 formed in advance or an alignment mark (not shown) that is formed by a crystallized silicon thin film patterning.

Figure 21A:
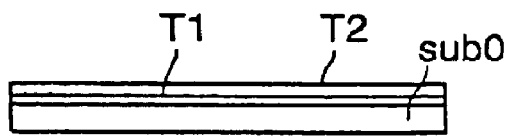
FIGS. 21A–21G are process flow diagrams showing a manufacturing process of a thin-film transistor according to a fourth embodiment of the present invention.
Figure 22A:
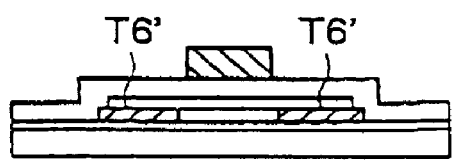
FIGS. 22A and 22B are process flow diagrams showing another example of the manufacturing process of a thin-film transistor according to the fourth embodiment of the present invention.
Figure 22B:
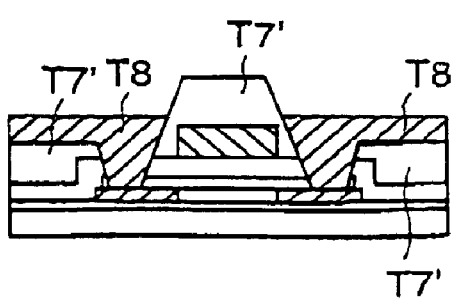

Referring to FIG. 21A, on a glass substrate sub0 from which organic materials, metals and fine particles have been removed by cleaning, a substrate cover film T1 and a silicon thin film T2 are sequentially formed.

Figure 21B:
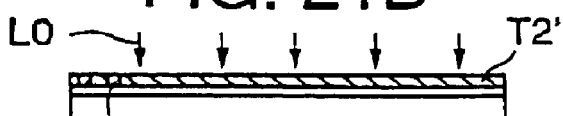
Figure 21C:
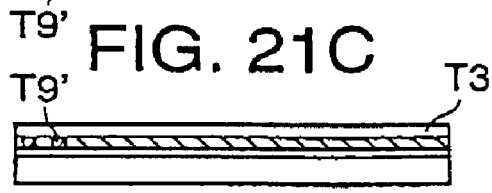

Referring to FIG. 21B, an alignment mark T9' is formed by irradiating the silicon thin film T2 with the beam using an optical mask including a part for the alignment mark. In this manner, the alignment mark area of the silicon thin film T2 is crystallized at the same time when the silicon thin film is exposed.

Figure 21D:
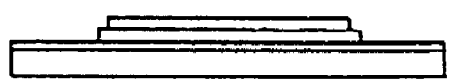
Figure 21E:
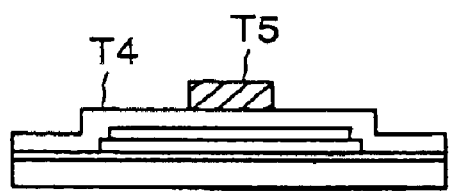
Figure 21F:
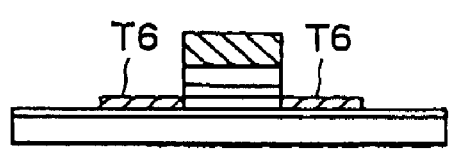
Figure 21G:
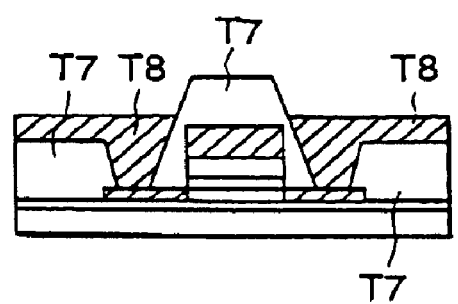

Referring to FIG. 21D, the alignment of photolithography is performed utilizing the crystallized alignment mark T9', and islands of a laminated film of a silicon thin film and a silicon oxide film are formed after etching as described before.

According to the manufacturing process explained above, a beam positioning is carried out using the alignment mark formed on the substrate. This has made it possible to align on a desired area with a positioning precision of $\mu$m order or above. As a result, it has become possible to minimize irradiation of laser beams onto an area that is finally removed by etching. Particularly, it has become possible to prevent a substrate from being damaged due to a variance in the intensity of the light source when the manufacturing process is applied to an imaging device like an LCD. It has also become possible to prevent a reduction in the picture quality due to a damaged substrate.

A surface of a thin film that has been partly reformed by a laser beam irradiation to have a partly active surface, is covered with other thin film. With this arrangement, it has become possible to prevent a pollution of and a combining of an unnecessary material onto the active surface at a next process. As a result, it is possible to obtain thin-film transistors of high reliability and high reproducibility.

By carrying out a reformation of a silicon thin film and a formation of an alignment mark at the same time in the laser beam irradiation process, an additional alignment forming process is not necessary. This prevents pollution of devices and reduces the manufacturing process. As a result, it is possible to substantially reduce the manufacturing cost. Thus, the invention has large industrial advantages.

Furthermore, with the above arrangement, it is possible to provide a high-performance multi-functional semiconductor forming device, a process of manufacturing a high-reproducibility thin-film transistor at low cost, and a high-performance thin-film transistor respectively, specifically, it is possible 1) to provide a high-stability semiconductor thin-film process that can omit a cleaning process using a chemical liquid, 2) to provide a multi-functional device capable of processing many stages in the same device, which makes it possible to reduce a total plant installation area (a space-saving semiconductor process), and 3) to manufacture a low-cost high-performance thin-film transistor of which silicon cleaning surface (interface) can be maintained without using a chemical liquid.

Further, in the above method, an alignment mark is formed by using a color difference between an area that has been exposed by the light irradiation and an area that has not been exposed by the light irradiation and that has a different optical color from that of the exposed area.

With this arrangement, it is possible to determine a device forming region in the subsequent thin-film transistor manufacturing process with reference to the semiconductor thin film which has been exposed by laser beam irradiation. In this case, there exist no materials other than for the semiconductor thin film and the insulation film. Therefore, it is easy to form a clean semiconductor-insulation film interface.

What is claimed is:

1. A method for forming a first-property semiconductor film at a desired position on a substrate, comprising the steps of:

preparing the substrate having a second-property semiconductor film formed thereon in a gas atmosphere with a pressure of substantially atmospheric pressure;

b) preparing an optical mask having a predetermined pattern on another substrate which is apart from the substrate;

c) relatively positioning a projection area of the optical mask at the desired position on the substrate;

d) irradiating the desired position of the second-property semiconductor film with laser light through the optical mask to change an irradiated portion of the second-property semiconductor film to the first-property semiconductor film; and e) forming an insulation film on the first-property semiconductor film and the second-property semiconductor film;

wherein the optical mask has an alignment mark pattern, wherein, in the step (d), an alignment mark corresponding to the alignment mark pattern is formed by the irradiation of the desired portion of the second-property semiconductor film with the laser light through the optical mask to change the irradiated portion of the second-property semiconductor film to the first-property semiconductor film, and wherein the alignment mark is visible due to a difference in optical characteristic between the first-property semiconductor film and the second-property semiconductor film.

2. The method according to claim 1, wherein a positioning process after the step (d) is performed with reference to the alignment mark.

3. The method according to claim 1, wherein the first-property semiconductor film is a crystalline semiconductor film and the second-property semiconductor film is an amorphous semiconductor film.

4. The method according to claim 3, further comprising the step of:

(f) forming an island comprised of the insulation film and the crystalline semiconductor film by a patterning process, wherein the crystalline semiconductor film of the island is a single-crystal semiconductor film used for source, drain, and channel regions of a field effect transistor.

* * * * *